United States Patent
Galor Gluskin et al.

(10) Patent No.: US 10,397,465 B2
(45) Date of Patent: Aug. 27, 2019

(54) EXTENDED OR FULL-DENSITY PHASE-DETECTION AUTOFOCUS CONTROL

(71) Applicant: QUALCOMM Incorporated, San Diego, CA (US)

(72) Inventors: Micha Galor Gluskin, San Diego, CA (US); Prajit Kulkarni, Santa Clara, CA (US); Jisoo Lee, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 98 days.

(21) Appl. No.: 15/693,855

(22) Filed: Sep. 1, 2017

(65) Prior Publication Data

US 2019/0075233 A1 Mar. 7, 2019

(51) Int. Cl.
*H04N 5/232* (2006.01)
*H04N 9/04* (2006.01)
*H04N 5/369* (2011.01)
*H04N 5/225* (2006.01)
*H01L 27/146* (2006.01)

(52) U.S. Cl.
CPC ....... *H04N 5/23212* (2013.01); *H04N 5/2254* (2013.01); *H04N 5/3696* (2013.01); *H04N 5/36961* (2018.08); *H04N 9/04557* (2018.08); *H01L 27/14621* (2013.01); *H01L 27/14623* (2013.01); *H01L 27/14627* (2013.01)

(58) Field of Classification Search
CPC .......... H04N 5/23212; H04N 5/36961; H04N 9/04557
See application file for complete search history.

(56) References Cited

U.S. PATENT DOCUMENTS

| | | | |
|---|---|---|---|
| 8,009,223 B2 | 8/2011 | Kusaka | |
| 9,445,018 B2 | 9/2016 | Fettig et al. | |
| 9,467,607 B2 | 10/2016 | Ng et al. | |
| 2014/0313380 A1* | 10/2014 | Aoki | H04N 5/3696 348/280 |
| 2017/0017136 A1 | 1/2017 | Kao et al. | |
| 2017/0110501 A1 | 4/2017 | Hsu et al. | |

* cited by examiner

*Primary Examiner* — Christopher K Peterson
(74) *Attorney, Agent, or Firm* — Duane Morris LLP

(57) ABSTRACT

Methods, systems, and apparatuses are provided to perform phase-detection autofocus control. By way of example, the methods can receive luminance values measured by a plurality of sensing elements in a sensor array, and the sensing elements can include imaging pixels and phase-detection pixels. The methods can compare luminance values measured by at least one of the phase-detection pixels to luminance values associated with a subset of the imaging pixels including two or more imaging pixels. The comparison can be performed at extended horizontal density or full horizontal density along a first sensor-array row that includes the at least one phase-detection pixel and the two or more imaging pixels. The methods can also perform a phase-detection autofocus operation based on an outcome of the comparison.

28 Claims, 21 Drawing Sheets

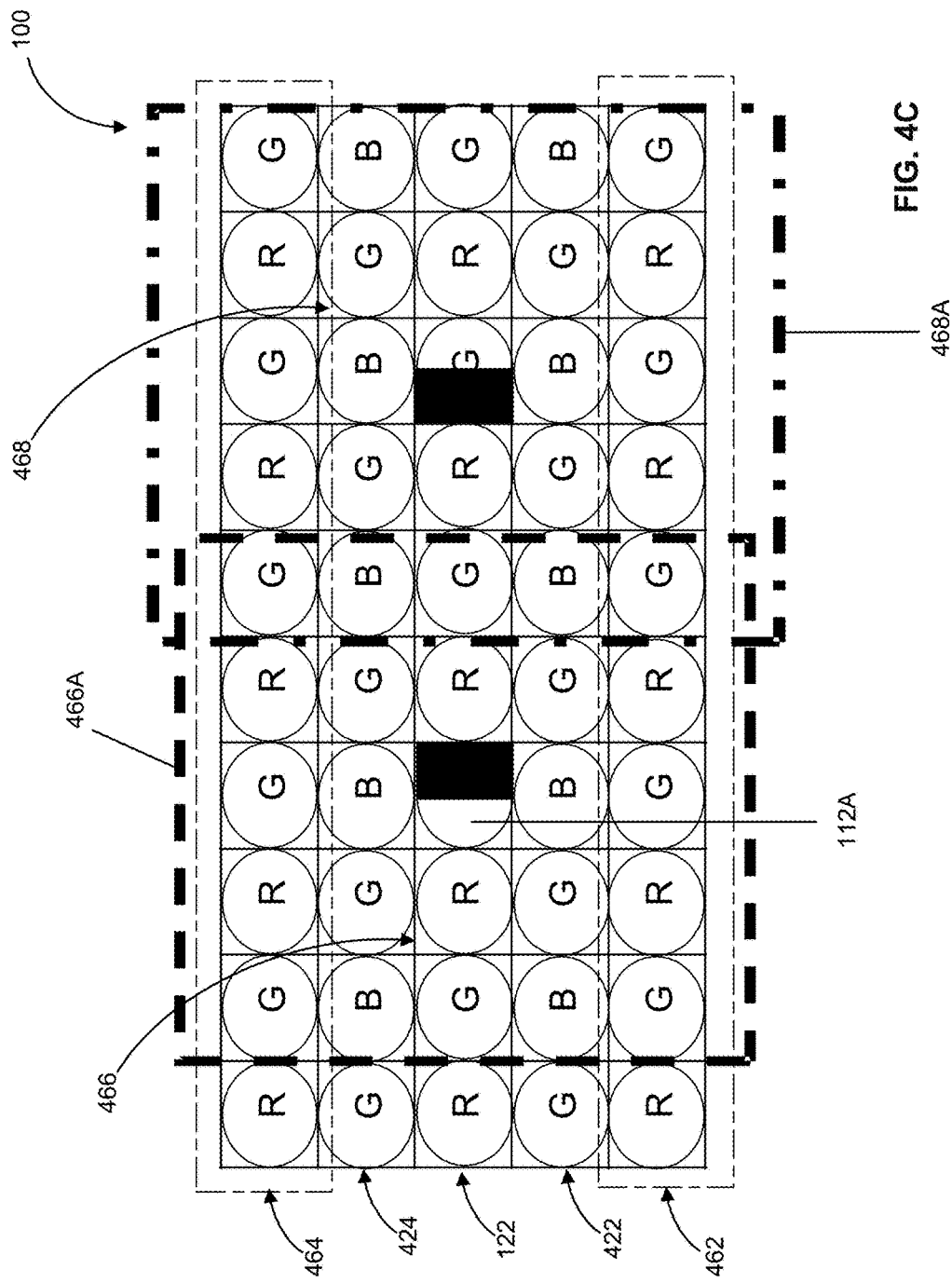

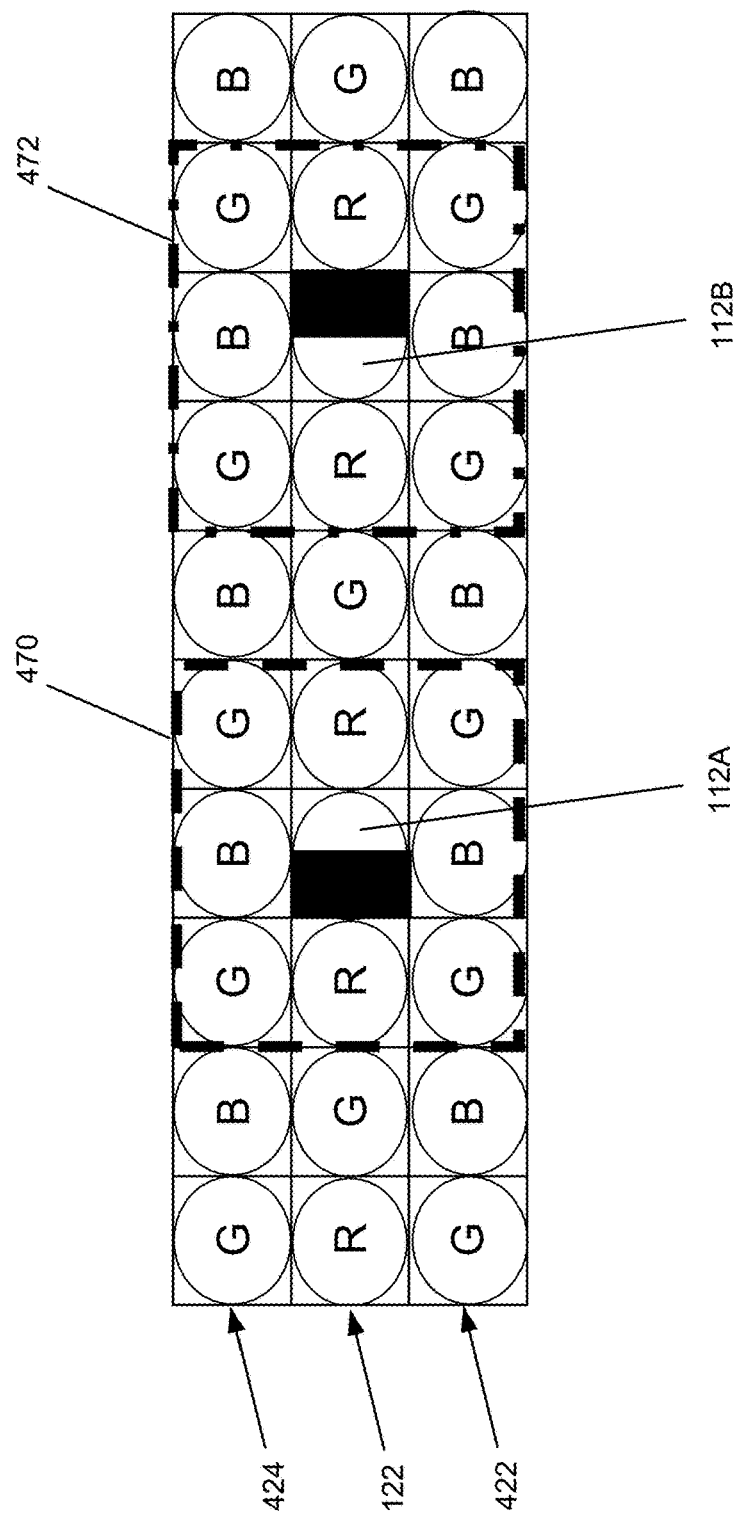

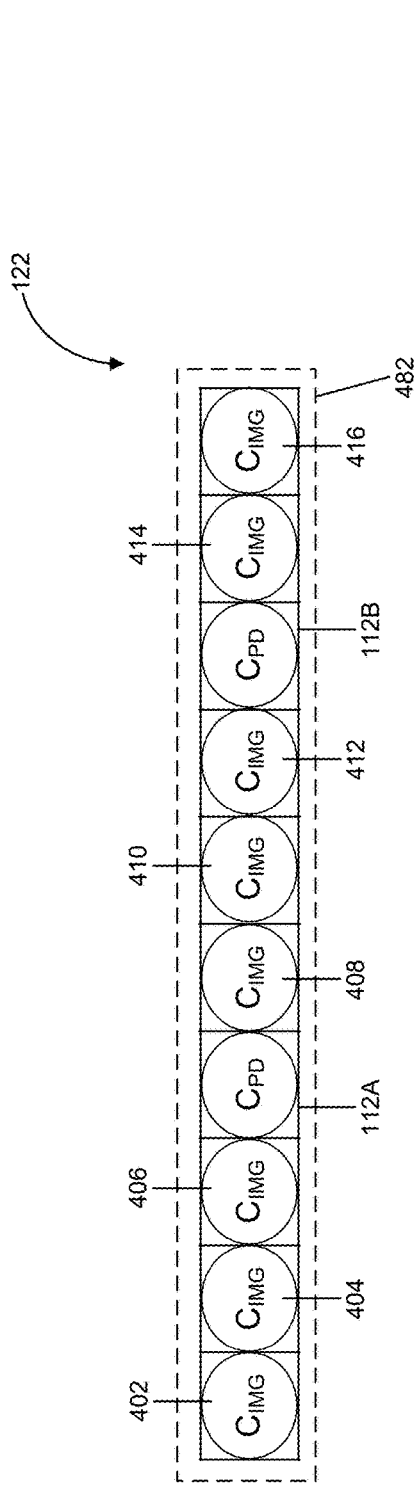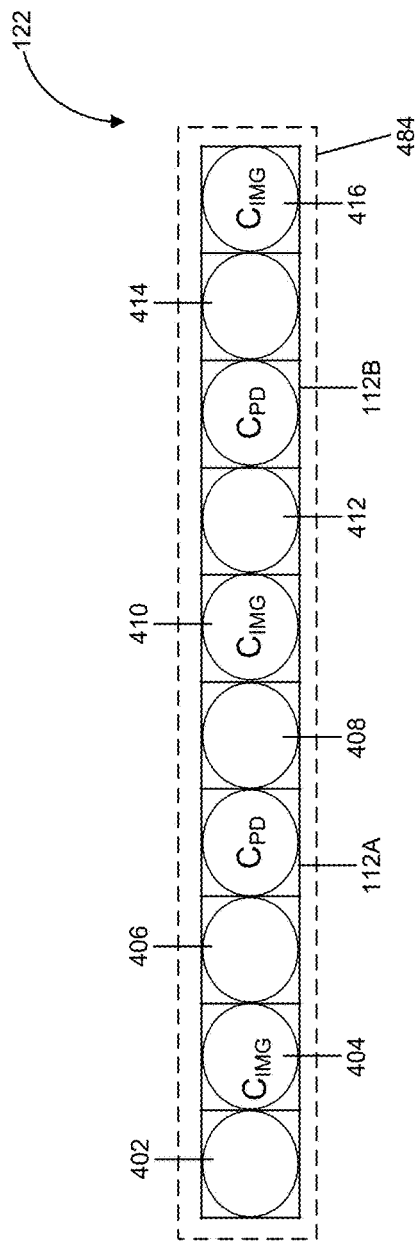

EXTENDED OR FULL-DENSITY PHASE-DETECTION AUTOFOCUS CONTROL

BACKGROUND

Field of the Disclosure

This disclosure generally relates to optical systems and processes and more specifically relates to phase-detection autofocus control.

Description of Related Art

Many image capture devices incorporate imaging sensors and hardware configured to capture and present image data to users. These devices, such as digital cameras, smartphone, and tablet computers, are often capable of detecting an occurrence of a defocus condition within captured image data, and of performing one or more autofocus processes that correct for the defocus condition and bring a target region of interest within the field of view of the image capture device into focus.

SUMMARY

In one example, a method for performing phase-detection autofocus control includes receiving, by one or more processors, luminance values measured by a plurality of sensing elements in a sensor array. The sensing elements can include imaging pixels and phase-detection pixels. The disclosed methods further include comparing, by the one or more processors, luminance values measured by at least one of the phase-detection pixels to luminance values associated with a subset of the imaging pixels including two or more imaging pixels. The comparing can be performed at extended horizontal density or full horizontal density along a first sensor-array row that includes the at least one phase-detection pixel and the two or more imaging pixels. The disclosed methods also include performing, by the one or more processors, a phase-detection autofocus operation based on an outcome of the comparison.

In one example, a device for performing phase-detection autofocus control includes a non-transitory, machine-readable storage medium storing instructions and at least one processor configured to be coupled to the non-transitory, machine-readable storage medium. The at least one processor is configured by the instructions to receive luminance data from a plurality of sensing elements in a sensor array. The sensing elements can include imaging pixels and phase-detection pixels, and the luminance data can include luminance values measured by the imaging pixels and phase-detection pixels. The at least one processor is further configured by the instructions to compare luminance values measured by at least one of the phase-detection pixels to luminance values associated with a subset of the imaging pixels including two or more imaging pixels. The comparison can be performed at extended horizontal density or full horizontal density along a first sensor-array row that includes the at least one phase-detection pixel and the two or more imaging pixels. The at least one processor is further configured by the instructions to perform a phase-detection autofocus operation based on an outcome of the comparison.

In one example, an apparatus for performing phase-detection autofocus control includes means for receiving luminance data from a plurality of sensing elements in a sensor array. The sensing elements can include imaging pixels and phase-detection pixels, and the luminance data can include luminance values measured by the imaging pixels and phase-detection pixels. The disclosed apparatus also includes means for comparing luminance values measured by at least one of the phase-detection pixels to luminance values associated with a subset of the imaging pixels including two or more imaging pixels. The comparing can be performed at extended horizontal density or full horizontal density along a first sensor-array row that includes the at least one phase-detection pixel and the two or more imaging pixels. The disclosed apparatus includes means for performing a phase-detection autofocus operation based on an outcome of the comparison.

In one example, a non-transitory, machine-readable storage medium stores program instructions that, when executed by at least one processor, perform a method for performing phase-detection autofocus control. The disclosed machine-readable storage medium includes instructions for receiving luminance data from a plurality of sensing elements in a sensor array. The sensing elements can include imaging pixels and phase-detection pixels, and the luminance data can include luminance values measured by the imaging pixels and phase-detection pixels. The disclosed machine-readable storage medium instructions for comparing luminance values measured by at least one of the phase-detection pixels to luminance values associated with a subset of the imaging pixels including two or more imaging pixels. The comparing can be performed at extended horizontal density or full horizontal density along a first sensor-array row that includes the at least one phase-detection pixel and the two or more imaging pixels. The disclosed machine-readable storage medium instructions for performing a phase-detection autofocus operation based on an outcome of the comparison.

BRIEF DESCRIPTION OF DRAWINGS

FIGS. 4A-4F, 5A, 5B, and 6 are diagrams illustrating an exemplary process for performing phase-detection autofocus control, according to some examples.

DETAILED DESCRIPTION

Figure 1A:
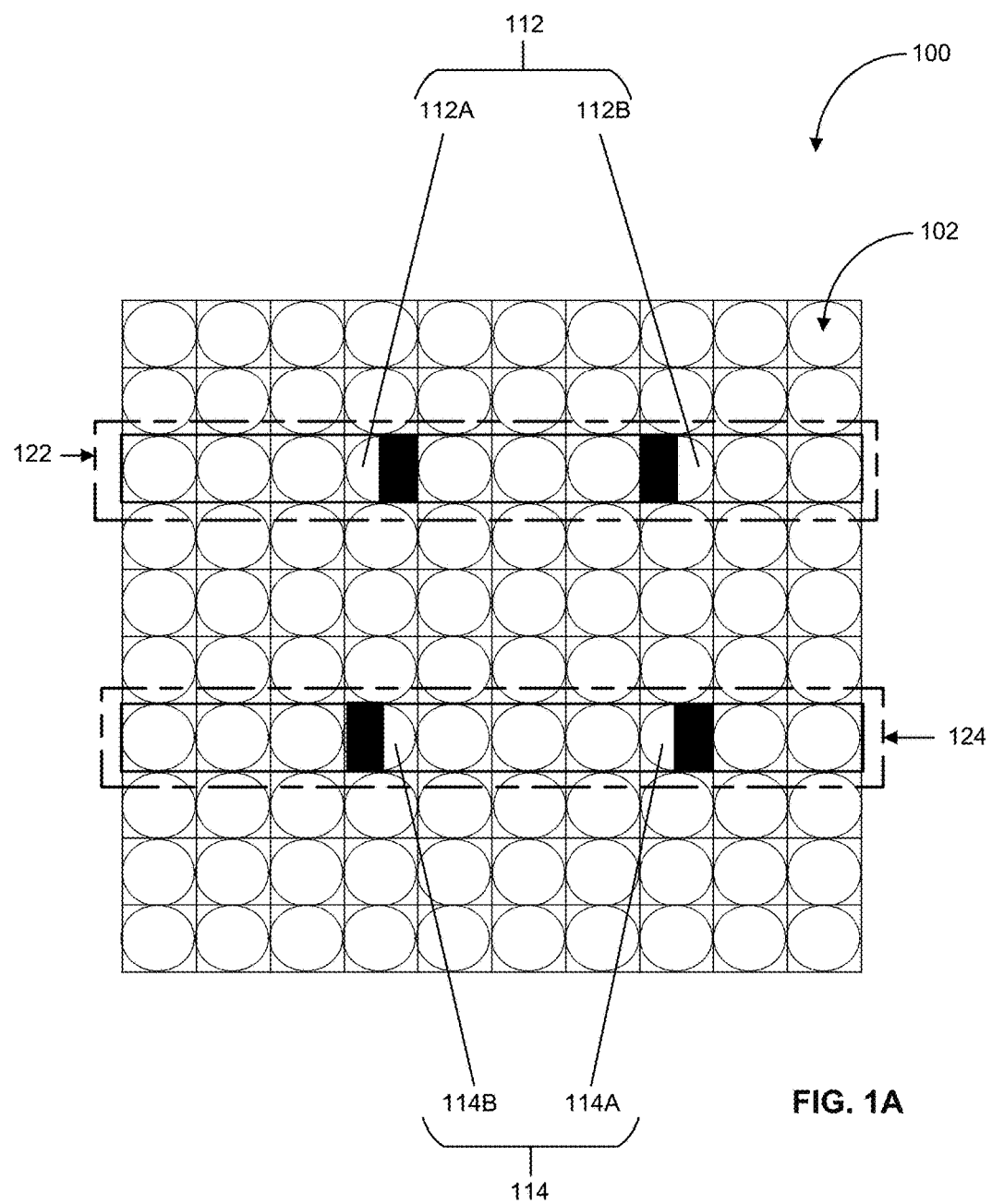
FIG. 1A is a plan view of an exemplary sensor array, according to some examples.

While the features, methods, devices, and systems described herein can be embodied in various forms, some exemplary and non-limiting embodiments are shown in the drawings, and are described below. Some of the components described in this disclosure are optional, and some implementations can include additional, different, or fewer components from those expressly described in this disclosure.

Relative terms such as "lower," "upper," "horizontal," "vertical,", "above," "below," "up," "down," "top" and "bottom" as well as derivative thereof (e.g., "horizontally," "downwardly," "upwardly," etc.) refer to the orientation as then described or as shown in the drawing under discussion. Relative terms are provided for the reader's convenience. They do not limit the scope of the claims.

Many devices, such as digital cameras, smartphones, and tablet computers, include imaging sensors and hardware configured to capture image data characterizing a target scene. For example, these devices can include one or more optical elements, such as an assembly of one or more lenses (e.g., a lens assembly) that collimate and focus incident light onto an array of sensing elements disposed at a corresponding imaging plane (e.g., a sensor array). As described in greater detail below, the sensor array can include a plurality of photodiodes formed within a semiconductor substrate, such as, but not limited to, a complimentary metal-oxide semiconductor (CMOS) image sensor or charge coupled device (CCD) sensor. The sensor array can also include a corresponding filter array (e.g., an array of color filters), and a plurality of microlenses that cover corresponding ones of the sensing elements and corresponding portions of the filter array. In some examples, described in greater detail below, the microlenses may be sized and positioned such that incoming light from the target scene propagates through each of the microlenses, and through a filter, before falling incident on a corresponding one of the photodiodes within the sensor array, or alternatively, on a corresponding subset of the photodiodes within the sensor array.

As described herein, each of the photodiodes may collect incident light and generate an electrical signal, which characterizes and measures a value of a luminance of the incident light (and when filtered by the color filters, a chrominance of the incident light). One or more processors of the image-capturing devices, such as a dedicated image signal processor, may convert the generated electrical signals representing luminance and chrominance values into corresponding image data characterizing the target scene. As used herein, the term "pixel" may refer to a single photodiode (or other sensing element that converts incident light into a corresponding electrical signal) in combination with adjacent components, such as the filter and microlens described above.

In some instances, the image capture devices can also perform one or more auto-focus control processes that detect an occurrence of a defocus condition based on phase difference data (also referred to as phase disparity data) or contrast data, and automatically modify an alignment or a positioning of a lens or sensor within the imaging system to correct the detected defocus condition and to bring the region of interest (ROI) within the field of view (FOV) of the sensor into focus. Examples of these auto-focus processes can include, but are not limited to, contrast-detection auto-focus control processes, phase-detection autofocus (PDAF) control processes, and other passive and active autofocus control processes. Further, these auto-focus processes may also be "hybrid" autofocus control processes that perform an initial, coarse correction of the defocus condition using a PDAF control process, and based on a resampling of the target scene, perform a subsequent, finer correction of the defocus condition using a contrast-detection process.

For example, to support PDAF control processing, the sensor array included within the imaging system of the device (e.g., the digital camera, smartphone, tablet computer, etc.) can include phase-detection sensors (e.g., "PD" pixels) and non-phase-detection pixels (e.g., "imaging" pixels). As described above, each of the imaging and PD pixels can include a photodiode formed in or on the substrate. Further, in some instances, a mask layer can be disposed over portions of the PD pixels to establish pairs selectively shielded PD pixels within the sensor array. The selectively shielded PD pixels may include a left-shielded PD pixel sensitive to light falling incident onto a right portion of the sensor (e.g., a "right" PD pixel), and right-shielded PD pixel sensitive to light falling incident onto a left portion of the sensor (e.g., a "left" PD pixel). In other instances, described below, a single microlens can be disposed over a pair of PD pixels to establish the left and right PD pixels that support PDAF processing.

In some instances, repeating, sparse patterns of the left and right PD pixels can be interspersed within the non-phase-detection sensing elements (i.e., "imaging" pixels) of the sensor array. For instance, the sparsely distributed pairs of left and right PD pixels can represent between 1% and 3% of the total number of pixels included within the sensor array. Based on the luminance or color component values measured by each of the sparsely distributed pairs of left and right PD pixels, the device can perform sparse PDAF control processing to determine a phase difference, to determine an autofocus adjustment corresponding to the established phase difference, and to align or a position one or more of the optical elements (e.g., a position of one or more lenses relative to the sensor array) to correct the defocus condition and bring the ROI within the target scene corresponding to a selected focus point into focus.

Although more computationally efficient than contrast-detection autofocus control processes and other passive or active autofocus control processes, sparse PDAF control processes are often susceptible to noise (e.g., thermal noise) and aliasing issues, in circumstances where the target scene includes high-frequency visual patterns (e.g., closely spaced parallel lines or edges). For example, due to the sparsity of the left and right PD pixels within the sensor array, the left and right PD pixels of one or more of the PD pixel pairs may be disposed on opposite sides of a sharp edge within the PD pixel data, which may introduce errors in the calculation of the lens position and the phase-detection offset data described above. Further, as many high frequency patterns emerge when the target ROI is in focus or is near a focused condition, sparse PDAF control processing can be susceptible to aliasing errors, such as an erroneous detection of a defocus condition.

In some implementations, the susceptibility of these sparse PDAF control processes can be mediated through performance, by the device, of a multi-stage autofocus control process that performs initial, coarse correction of the defocus condition using sparse PDAF control processing, and based on a resampling of the target scene, perform a subsequent, finer correction of the defocus condition using a contrast-detection autofocus control process (or other passive or active technique that is less sensitive to noise-induced or aliasing-based errors). While these multi-stage control processes may be effective in reducing the noise- and aliasing-based errors inherent to sparse PDAF control processing, the performance of the multi-stage autofocus control process may reduce an efficiency at which the device positions the lens and an accuracy of that positioning, when the target scene is rapidly changing or when the device experiences movement during operation.

In some instances, rapid changes in the target scene or a movement of the device (e.g., due to hand shaking or unsteadiness of an operator) can induce a momentary loss of contrast and motion blurring during contrast-detection autofocus control processing and can introduce errors into the resulting correction data. Also, contrast-detection autofocus has a longer duration, as the lens overshoots an optimal lens position and returns to that optimal lens position. For these reasons, these contrast-detection autofocus control processes (e.g., implemented alone or as a step in a multi-stage autofocus process) can be characterized by a response time that is slower than comparable sparse PDAF control processing, and is susceptible to iterative correction processes, e.g., "hunting behavior," and correction errors due to movement of the device or motion within the target scene.

In other implementations, an increase in a density of left- and right-shielded PD pixel pairs within the corresponding sensor array may reduce the sparsity of center pixel lines and the resulting sum of the absolute differences (SAD) vector, and may limit an impact of noise-induced or aliasing-based errors on the phase-detection offset data output from these sparse PDAF control processing techniques. For example, as the density of left- and right-shielded PD pixels within the corresponding sensor array increases towards full density (e.g., that each pixel within the sensor array corresponds to either a left-shielded or a right-shielded pixel), occurrences of aliasing-based errors within sparse PDAF control processing may be reduced or eliminated.

Such increases in PD-pixel density can, however, result in a corresponding increase in a number of artifacts visible within image data captured by the sensor array. The shielded PD pixel provides phase information, but does not provide useful luminance information, so a replacement of an imaging pixel within the sensor array by either a left- or right-shielded pixel results in a missing pixel. The intensity data collected by each of the PD pixels within the sensor array can be replaced by interpolated values from imaging pixels that surround the PD pixels. In some instances, the interpolation of the imaging pixel data can introduce artifacts at positions within the image data that correspond to the PD pixels, e.g., when the target scene includes high-frequency patterns (e.g., closely spaced parallel lines or small features).

For these reasons, any implementation that increases the density of the left- and right-shielded PD pixel pairs can also increase a computational cost associated with the processing of the PD pixel data (e.g., due to the resulting interpolation of the imaging pixel data), and can introduce additional artifacts visible within the image data. Further, implementations that increase the density of the left- and right-shielded PD pixel pairs within the sensor array can also increase cost and complexity of the underlying sensor array.

In further implementations, the noise-induced and aliasing based errors characteristic of sparse PDAF control processing can be mediated by applying an extended-density or full-density PDAF control process to values of luminance or color components measured by a sensor array. The sensor array includes a plurality of imaging pixels (e.g., maskless photodiodes configured to sample incident light with or without a color filter) and sparsely distributed, interspersed left and right PD pixels (e.g., a corresponding pair of right- and left-shielded PD pixels, or a pair of imaging pixels that share a single microlens). As described below, these extended density or full-density PDAF control processes, as applied to luminance or color component values measured by the sensor array, can reduce errors related to random noise and aliasing, and can be used in addition to, or as an alternative to, any of the sparse PDAF processing control techniques described above.

FIG. 1A illustrates an exemplary portion of a sensor array 100 that supports a performance of the exemplary full-density PDAF control processing techniques described herein. In FIG. 1A, sensor array 100 may include a plurality of imaging pixels, shown generally at 102. Sensor array 100 may also include one or more pairs of phase-detection (PD) pixels (phase detection elements), such as PD pixel pairs 112 and 114, which may be interspersed among imaging pixels (imaging elements) 102 in accordance with an established and repeated pattern. As described herein, PD pixel pair 112 includes a left PD pixel 112A, and a right PD pixel 112B, and PD pixel pair 114 includes a left PD pixel 114A, and a right PD pixel 114B. In some examples, illustrated in FIG. 1A, imaging pixels 102 and PD pixel pairs 112 and 114 may be arranged in corresponding rows and columns, e.g., within a rectangular array. For instance, as illustrated in FIG. 1A, PD pixel pair 112 may be disposed among imaging pixels 102 within row 122 of sensor array 100, and PD pixel pair 114 may be disposed among imaging pixels 102 within row 124 of sensor array 100. In other examples, PD pixel pairs 112 and 114, and other sparsely distributed pixel pairs within sensor array 100 (not illustrated in FIG. 1A), may be disposed within imaging pixels 102 along any other row of sensor array 100 (including a common row), along any column of sensor array 100, or in accordance with any additional or alternative orientation within sensor array 100.

Figure 1B:
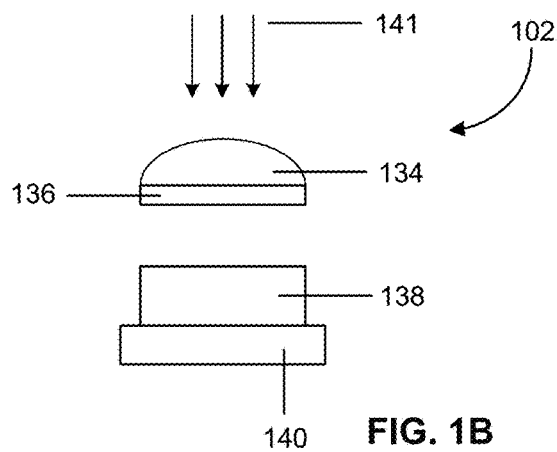
FIGS. 1B, 1C, and 1D illustrate sectional views of the exemplary sensor array shown in FIG. 1A, according to some examples.

Referring to FIG. 1B, each of imaging pixels 102 may include a microlens 134, a filter, such as color filter 136, and corresponding photodiode 138 disposed onto a portion of a substrate 140. In some examples, microlens 134 may be dimensioned and positioned over color filter 136 and photodiode 138 such that light from a target scene propagates through microlens 134 and through color filter 136 before falling incident on photodiode 138, which collects the incident light and generates an electrical signal indicative of a value of a luminance of the collected light. As will be described in greater detail below, one or more processors of an image capture device that includes sensor array 100 may detect the electrical signal generated by each of imaging pixels 102 and convert the detected electrical signals into corresponding portions of image data that characterize the target scene.

Color filter 136 can act as a wavelength-selective pass band filter that selectively removes unwanted light spectrum from respective color channels of incoming light. In some instances, color filter 136 can include, but is not limited to, a red color filter, a green color filter, or a blue color filter configured to allow corresponding ones of red, green, and blue light to propagate through and fall incident onto photodiode 138. Further, while visible red, blue, and green color filters can be incorporated into sensor arrays, color filter 136 may be configured allow any additional or alternative range of wavelengths, such as those characteristic of other visible colors, to propagate through and fall incident onto photodiode 138. In other instances, color filter 136 may be configured to selectively admit light having a wavelength range invisible to the human eye, such as ultraviolet light, near infrared light, or thermal (infrared) radiation. Further, and in additional examples, one or more of imaging pixels 102 can omit color filter 136 (and any other filtering assembly), and the resulting filterless imaging pixel can correspond to a white or monochrome sensor.

Microlens 134 may be disposed above color filter 136, which may be positioned above photodiode 138. Accordingly, light from the target scene first passes through microlens 134, then falls incident on and passes through color filter 136 (and is filtered according to wavelength, as described above), and finally falls incident on photodiode 138.

Further, PD pixel pair 112 includes left PD pixel 112A and right PD pixel 112B, and PD pixel pair 114 includes left PD pixel 114A and right PD pixel 114B. Each of left PD pixels 112A and 114A can be a right-shielded PD pixel having a mask layer that selectively shields a right-side portion of a corresponding photodiode from incident light (e.g., from the target scene), while exposing a left-side portion of the corresponding photodiode to the incident light. Similarly, each of right PD pixels 112B and 114B can be a left-shielded PD pixel having a mask layer that selectively shields a left-side portion of a corresponding photodiode from incident light (e.g., from the target scene), while exposing a right-side portion of the corresponding photodiode to the incident light. Accordingly, each of left PD pixels 112A and 114A may be sensitive to and capable of detecting light falling incident onto the left-side portion of its corresponding photodiode, and each of right PD pixels 112B and 114B may be sensitive to and capable of measuring light falling incident onto the right-side portion of its corresponding photodiode.

Figure 1C:
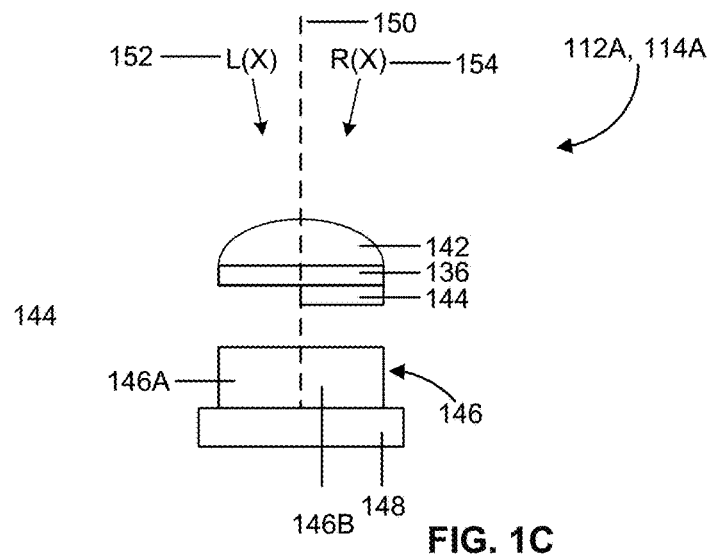

For example, as illustrated in FIG. 1C, left PD pixels 112A and 114A may each include a microlens 142, a filter, such as color filter 136, a mask layer 144, and a corresponding photodiode 146 disposed on or in a portion of a substrate, such as substrate 140. Mask layer 144 can be formed from materials that include, but are not limited to, a metal, a semiconductor, a semiconductor oxide, or other materials capable of absorbing light received by left PD pixels 112A and 114A (e.g., light having visible, ultraviolet, or infrared wavelengths). Further, a position of mask layer 144 relative to positions of color filter 136 and microlens 142 may vary within left PD pixels 112A and 114A, and in some instances, color filter 136 may be disposed above mask layer 144 (e.g., as illustrated in FIG. 1C). In other instances, mask layer 144 can be disposed above both microlens 142 and color filter 136 or may be disposed above color filter 136 and below microlens 142 (not illustrated in FIG. 1C).

In some examples, mask layer 144 may be dimensioned and disposed within left PD pixels 112A and 114A to selectively shield a right-side portion 146B of photodiode 146 from light falling incident on microlens 142 and color filter 136, while allowing light to fall incident onto and be collected by a left-side potion 146A of photodiode 146. For example, light incident in a first direction, e.g., light R(X) 154 entering microlens 142 on a first side of dashed line 150, can be absorbed by or otherwise blocked by mask layer 144. In other instances, light incident in a second direction, e.g., light L(X) 152 entering microlens 142 on a second side of dashed lined 150, can propagate through microlens 142 and color filter 136 and be collected by portion 146A of photodiode 146.

Figure 1D:
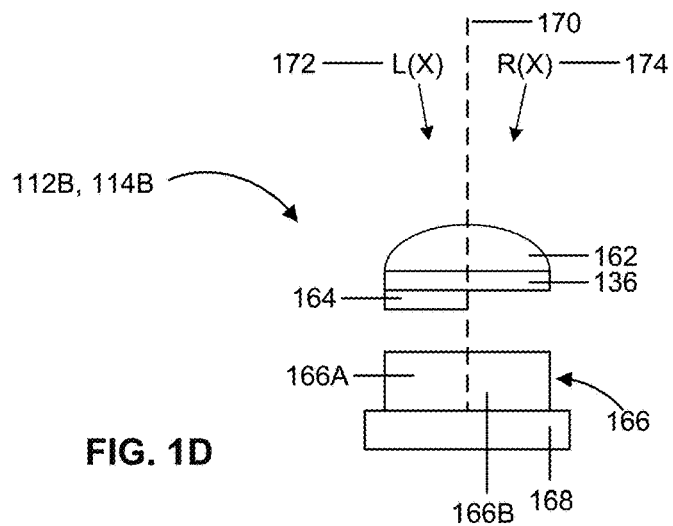

In additional examples, as illustrated in FIG. 1D, right PD pixels 112B and 114B may each include a microlens 162, a filter, such as color filter 136, a mask layer 164, and a corresponding photodiode 166 disposed on a portion of a substrate, such as substrate 168. As described above, mask layer 164 can be formed from materials that include, but are not limited to, a metal, a semiconductor, a semiconductor oxide, or other materials capable of absorbing light received by right PD pixels 112B and 114B (e.g., light having visible, ultraviolet, or infrared wavelengths). Further, a position of mask layer 164 relative to positions of color filter 136 and microlens 162 may vary within right PD pixels 112B and 114B. In some instances, color filter 136 may be disposed above mask layer 164. In other instances, mask layer 164 can be disposed above both microlens 162 and color filter 136 or may be disposed above color filter 136 and below microlens 162 (not illustrated in FIG. 1D).

Further, mask layer 164 may be dimensioned and disposed within right PD pixels 112B and 114B to selectively shield a left-side portion 166A of photodiode 166 from light falling incident on microlens 162 and color filter 136, while allowing light to fall incident onto and be collected by a right-side potion 166B of photodiode 166. For example, light incident in a first direction, e.g., light L(X) 172 entering microlens 162 on a first side of dashed line 170, can be absorbed by or otherwise blocked by mask layer 164. In other instances, light incident in a second direction, e.g., light R(X) 174 entering microlens 162 on a second side of dashed lined 170, can propagate through microlens 162 and color filter 136 and be collected by portion 166B of photodiode 166.

As described above, each of imaging pixels 102 and PD pixel pairs 112 and 114 (shown in FIGS. 1A-1D) may include a color filter (e.g., color filter 136, FIGS. 1C, 1D) that selectively filters incoming light, and allows filtered light having a particular wavelength range to propagate through and fall incident on at least a portion of a corresponding photodiode, e.g., photodiode 138 (FIG. 1B), 146 (FIG. 1C), or 166 (FIG. 1D). For example, one or more of imaging pixels 102 within sensor array 100 can include a color filter that admits light having a wavelength range corresponding to a visible green color (e.g., a green color filter). In additional instances, one or more of imaging pixels 102 within sensor array 100 can include a color filter that admits light having a wavelength range corresponding to a visible red color (e.g., a red color filter) or a visible blue color (e.g., a blue color filter).

Figure 1E:
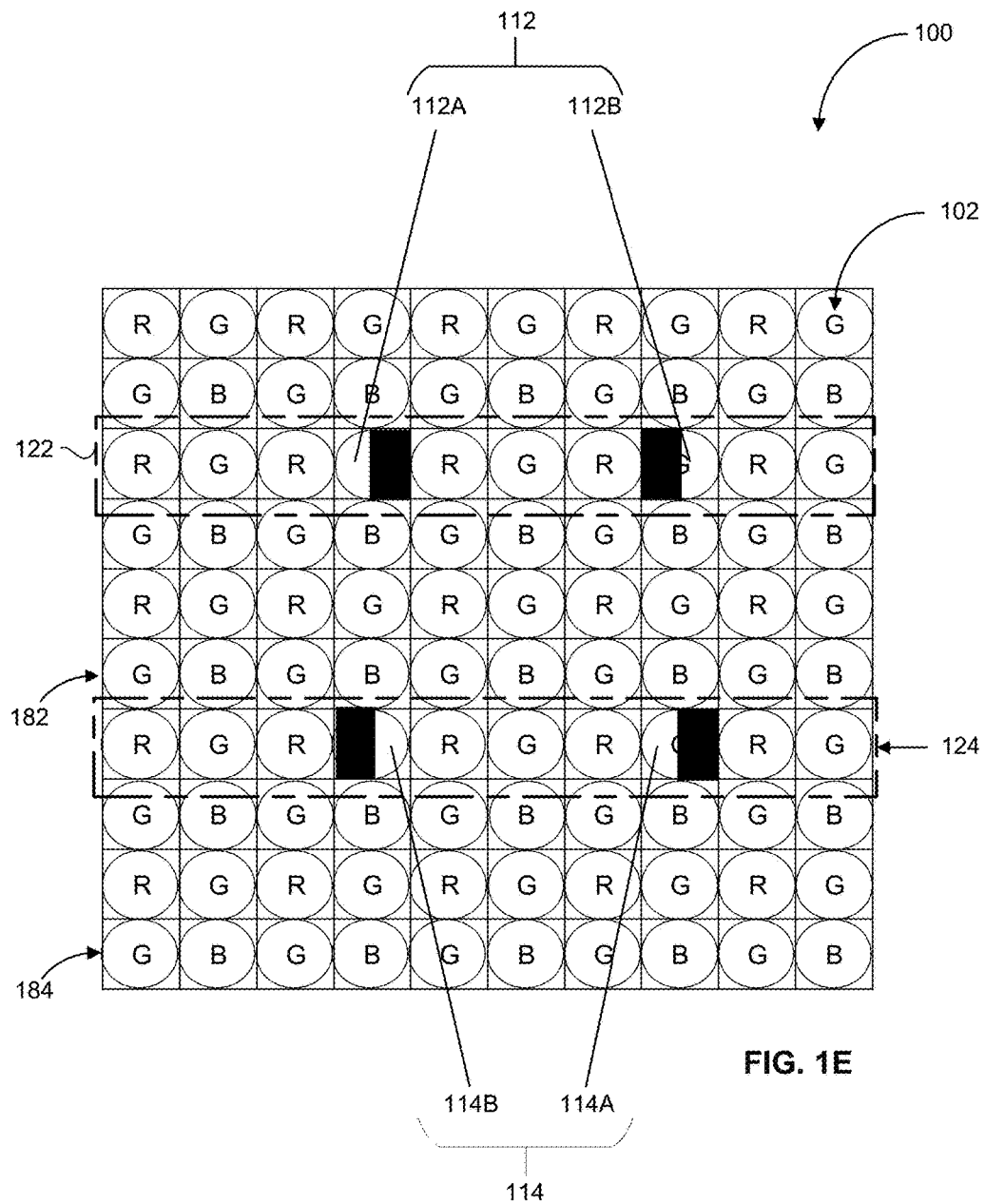
FIG. 1E is an additional plan view of the exemplary sensor array shown in FIG. 1A, according to some examples.

In some implementations, imaging pixels 102 can be arranged within sensor array 100 in accordance with a predetermined pattern established based on the color of each corresponding color filter. By way of example, imaging pixels 102 that include red, green, and blue color filters (e.g., "red" imaging pixels, "green" imaging pixels, and "blue" imaging pixels) can be disposed within sensor array 100 in accordance with a Bayer pattern. As illustrated in FIG. 1E, the Bayer pattern arranges imaging pixels 102 into alternating sensor-array rows of red imaging pixels (e.g., denoted by "R" in FIG. 1E) and green imaging pixels (e.g., denoted by "G" in FIG. 1E), and sensor-array rows of green imaging pixels and blue imaging pixels (e.g., denoted by "B" in FIG. 1E). For instance, sensor-array rows 122 and 124 in FIG. 1E include alternating red and green imaging pixels (e.g., referred to as "R-G" sensor-array rows), and sensor-array rows 182 and 184 include alternating green and blue imaging pixels (e.g., referred to as "G-B" sensor-array rows).

As further illustrated in FIG. 1E, the sparse disposition of PD pixel pairs 112 and 114 within sensor array can displace corresponding ones of the red, blue, or green imaging pixels and reduce an amount and intensity of light collected by sensor array 100. For example, each of left PD pixel 112A, right PD pixel 112B, left PD pixel 114A and right PD pixel 114B can include a green color filter, and when disposed within sensor array 100, can displace a green imaging pixel or a blue imaging pixel within sensor array 100. In other examples, left PD pixel 112A, right PD pixel 112B, left PD pixel 114A or right PD pixel 114B can include a red color filter or a blue color filter, and can be disposed within sensor array 100 to displace a red imaging pixel, a green imaging pixel, or a blue imaging pixel. Further, in some examples, left PD pixel 112A, right PD pixel 112B, left PD pixel 114A or right PD pixel 114B can omit a color filter or other filtering layer, and can displace a corresponding one of the red, green, or blue imaging pixels within sensor array 100 (e.g., and as described herein, the photodiodes incorporated within these filterless PD pixels can be configured to function as monochrome sensors).

As each of the disposed PD pixels displaces a green imaging pixel, or a red or blue imaging pixel, the disposition of PD pixel pairs 112 and 114 within sensor array 100 creates missing pixel sites in the sensor array. Through selective positioning of the mask layer (e.g., mask layers 144 or 164 of FIGS. 1C and 1D respectively), one or more of the disposed PD pixels can be configured to collect 40%, 50% or 60% of the light collected by the corresponding imaging pixels, or any additional or alternate portion of the light collected by a corresponding imaging pixel capable of yielding a symmetric, directional response between pairs of the disposed PD pixels. (so long as the shielding is positioned to provide an asymmetric directional response).

Sensor array 100 is, however, not limited to red, green, and blue imaging pixels disposed in accordance with the Bayer pattern. In other examples, not depicted in FIGS. 1A-1E, imaging pixels 102 can be disposed in any additional or alternative pattern or red, green, and blue imaging pixels (or imaging pixels including color filters that allow a propagation of light having other visible wavelengths). Further, and as described above, one or more imaging pixels within sensor array 100 can also include a filter that admits light having a non-visible wavelength range, such as ultraviolet light or infrared light. In other instances, described herein, one or more imaging pixels within sensor array 100 can omit a color filter or other filtering layer (e.g., color filter 136), and the photodiodes incorporated within these filterless imaging pixels can be configured to function as a monochrome sensor.

In some examples, described above, pairs of phase-detection (PD) pixels are generated by selectively masking photodiodes included within corresponding pairs of pixels. The selectively masked photodiodes may, in some instances, establish left-shielded PD pixels (e.g., right PD pixels, in which a right-side portion of the corresponding photodiode is sensitive to light) and right-shielded PD pixels (e.g., left PD pixels, in which a left-side portion of the corresponding photodiode is sensitive to light). As described below, phase-detection autofocus information can be derived from comparisons of the image data captured by each of the sparsely distributed pairs of left and right PD pixels within sensor array 100.

Figure 2A:
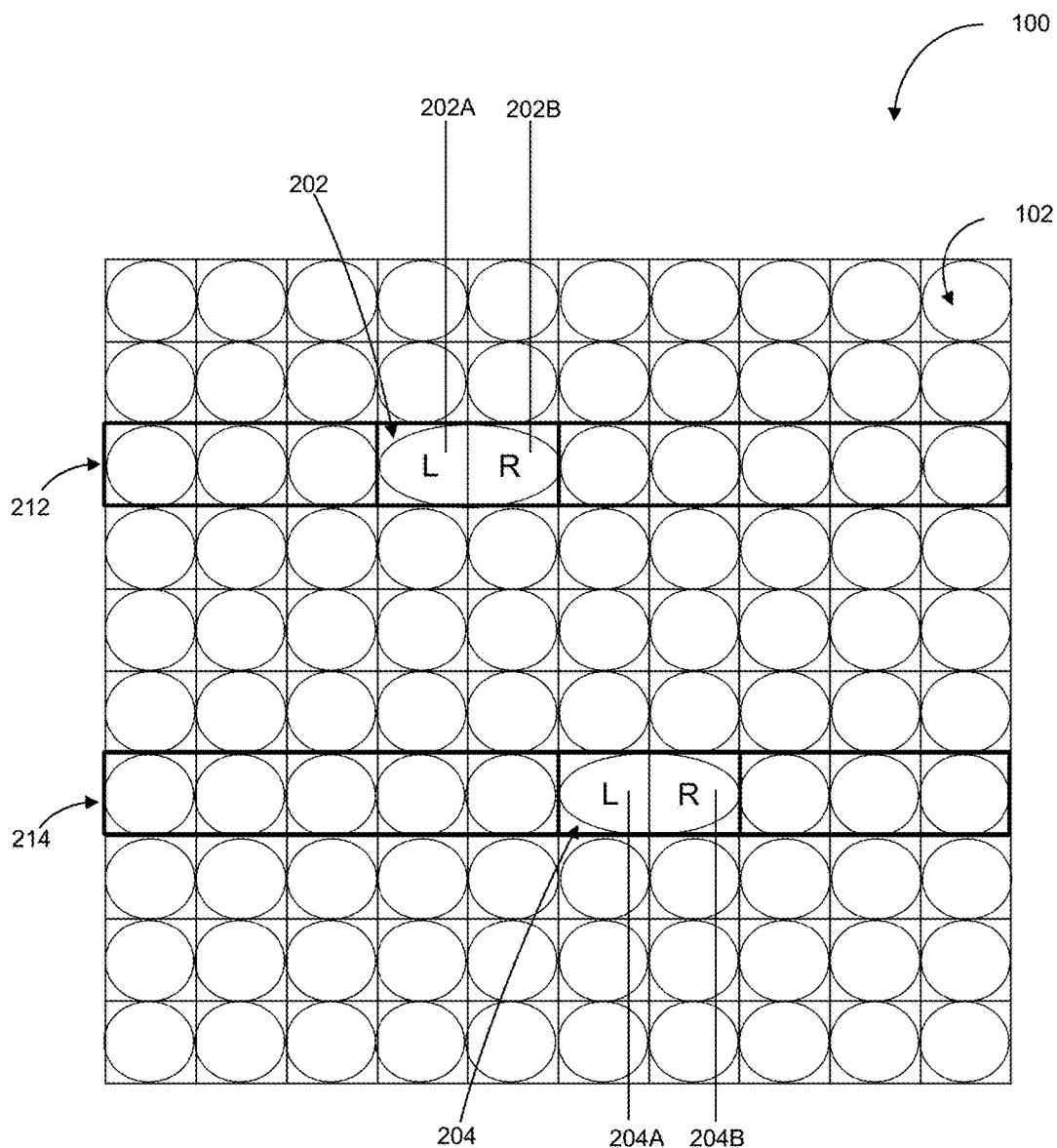
FIG. 2A is a plan view of an additional exemplary sensor array, according to some examples.

In other examples, sparsely distributed pairs of PD pixels can be formed within sensor array 100 by selective positioning of a single microlens structure (e.g., an elongated multi-lens) over components of corresponding pairs of adjacent imaging pixels 102 within sensor array 100. For example, as illustrated in FIG. 2A, sensor array 100 may include a plurality of imaging pixels, shown generally at 102. Sensor array 100 may also include one or more maskless PD pairs of phase-detection (PD) pixels, such as maskless PD pixel pairs 202 and 204, which may be interspersed among imaging pixels 102 in accordance with an established and repeated pattern. In some examples, illustrated in FIG. 2A, imaging pixels 102 and maskless PD pixel pairs 202 and 204 may be arranged in corresponding sensor-array rows and columns, e.g., within a rectangular array. For instance, maskless PD pixel pair 202 may be disposed among imaging pixels 102 within a first row 212 of sensor array 100, and maskless PD pixel pair 204 may be disposed among imaging pixels 102 within a second sensor-array row 214 of sensor array 100.

Further, as described herein, maskless PD pixel pair 202 can be established through a selective positioning of an elongated microlens over components of adjacent imaging pixels to form a left PD pixel 202A and a right PD pixel 202B. Similarly, maskless PD pixel pair 204 can be formed through a selective positioning of an elongate microlens over components of adjacent imaging pixels to form a left PD pixel 204A and a right PD pixel 204B. Although not illustrated in FIG. 2A, sensor array 100 may include any additional or alternative number of maskless PD pixel pairs, which may be sparsely distributed within sensor array 100 in accordance with any appropriate pattern.

Figure 2B:
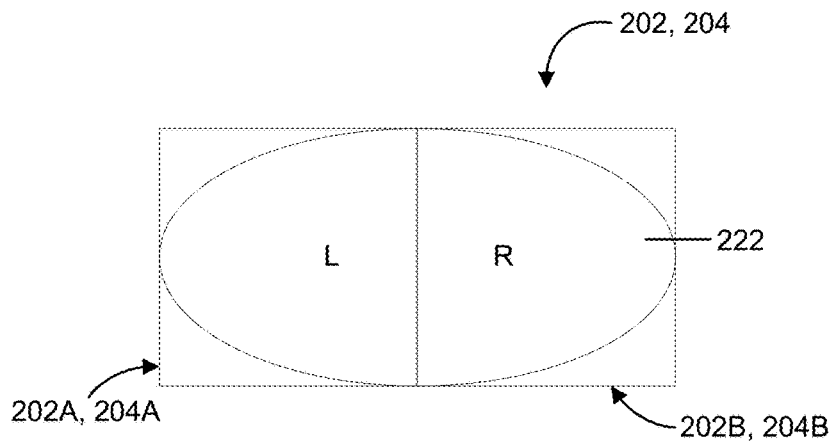
FIGS. 2B and 2C illustrate plan and sectional views of exemplary phase-detection pixels, according to some examples.
Figure 2C:
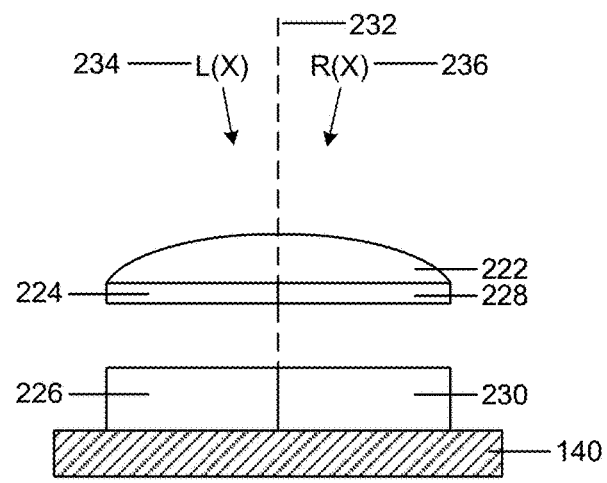

As illustrated in FIGS. 2B and 2C, each of left PD pixels 202A and 204A can include a corresponding filter, such as color filter 224, disposed over a corresponding sensor, such as photodiode 226. Further, each of right PD pixels 202B and 204B can also include a corresponding filter, such as color filter 228, disposed over a corresponding sensor, such as photodiode 230. In some examples, an elongated, oval-shaped microlens, e.g., microlens 222, is dimensioned and positioned over color filters 224 and 228 and photodiodes 226 and 230 such that light from a target scene propagates through microlens 222 and through color filters 224 and 228 before falling incident on photodiodes 226 and 230, which collect the incident light and generate electrical signals indicative of values of a luminance or color component of the collected light. As described below, one or more processors of an image capture device that includes sensor array 100 may detect the electrical signal generated by each of photodiodes 226 and 230 (and photodiodes within other imaging pixels and PD pixel pairs within sensor array 100), and convert the detected electrical signals into corresponding portions of image data that characterize the target scene.

For example, as shown in FIG. 2C, light incident in a first direction, e.g., light L(X) 234 entering microlens 222 on a first side of dashed line 232, can propagate through a portion of microlens 222 and through color filter 224, and be collected by photodiode 226 within each of left PD pixels 202A and 204A. Further, light incident in a second direction, e.g., light R(X) 236 entering microlens 222 on a second side of dashed line 232, can propagate through a portion of microlens 222 and through color filter 228, and be collected by photodiode 230 within each of right PD pixels 202B and 204B. In some instances, the luminance (or color component) values generated by left and right PD pixels 202A and 202B, and by left and right PD pixels 204A and 204B, correspond to left and right pixel values for respective ones of PD pixel pairs 202 and 204, and establish values of pixel offsets during a calculation of a phase-detection autofocus adjustment, as described below.

In FIGS. 2B-2C, microlens 222 is dimensioned and positioned over two adjacent imaging pixels disposed within a single sensor-array row of sensor array 100 (e.g., and represents a "2×1" microlens). In other examples, not illustrated in FIGS. 2A-2C, microlens 222 may be dimensioned and positioned over any additional or alternative number of adjacent imaging pixels, such as, but not limited to, a square subarray of four imaging pixels disposed across two adjacent sensor-array rows of sensor array 100 (e.g., a "2×2" microlens) or of nine imaging pixels disposed across three adjacent sensor-array rows of sensor array 100 (e.g., a "3×3" microlens).

In some examples, as described herein, an image capture device, such as a digital camera, a smartphone, or a tablet computer, can include one or more imaging assemblies configured to capture image data characterizing a target scene. These imaging assemblies can include one or more optical elements, such as a lens assembly that focus incoming light onto an array of sensors disposed at a corresponding imaging plane, e.g., sensor array 100. In some examples, the device can perform one or more of the exemplary, extended density or full-density PDAF control processes to generate phase-detection offset data indicative of one or more characteristics of a front- or back-focus condition, and to and generate a lens position command signal to modify an alignment or a positioning of one or more components of the lens assembly (e.g., a position of a primary lens relative to sensor array 100 or to other components) to correct the front- or back-focus condition and bring the target scene into focus.

Figure 3:
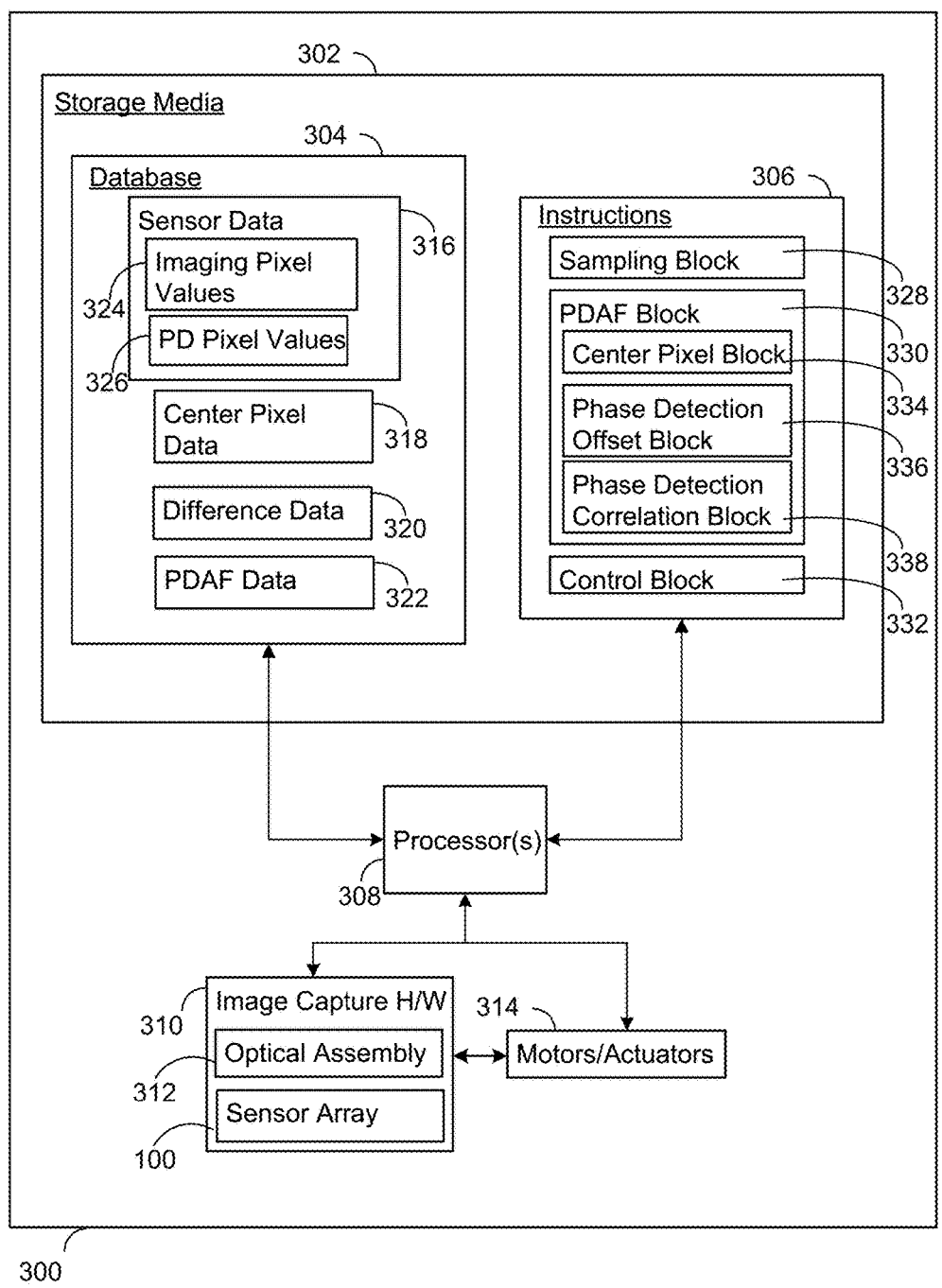
FIG. 3 is a block diagram illustrating components of an exemplary image capture device, according to some examples.

FIG. 3 is a schematic block diagram illustrating exemplary components of an image capture device 300. Examples of image capture devices 300 include, but are not limited to, a digital camera, a smartphone, a tablet computer, a laptop or desktop computer, and additional or alternative mobile devices or communications devices. Image capture device 300 can include a tangible, non-transitory, machine-readable storage medium (e.g., "storage media") 302 having a database 304 and instructions 306 stored thereon. Image capture device 300 can include one or more processors, such as processor 308, for executing instructions 306 or for facilitating storage and retrieval of data at database 304.

Processor 308 can also be coupled to image capture hardware 310, which include one or more optical assembly 312 and imaging sensors, such as sensor array 100. As described above, optical assembly 312 can include a lens assembly, which can focus incoming light onto the one or more imaging pixels and PD pixels, and corresponding photodiodes, within sensor array 100. Further, as illustrated in FIG. 3, processor 308 can also be coupled to provide one or more electrical motors or actuators 314, which can adjust a positioning of one or more of optical assembly 312 relative to sensor array 100 to correct a detected defocus condition, e.g., the front- or back-focus conditions described above.

By way of example, processor 308 can include one or more distinct processors, each having one or more cores. Each of the distinct processors can have the same structure or respectively different structure. Processor 308 can also include one or more central processing units (CPUs), one or more graphics processing units (GPUs), application specific integrated circuits (ASICs), digital signal processors (DSPs), or combinations thereof. If processor 308 is a general-purpose processor, processor 308 can be "configured to" by instructions 306 to serve as a special-purpose processor and perform a certain function or operation. Further, in some examples, a single processor 308 performs image processing functions and other instruction processing, such as autofocus correction using the exemplary, full-density PDAF control processing described herein. In other examples, image capture device 300 can include a separate image signal processor that performs image processing.

Database 304 may include a variety of data, such as sensor data 316, center pixel data 318, difference data 320, and PDAF data 322. In one example, illustrated in FIG. 3, sensor data 316 may include imaging pixel values 324 and PD pixel values 326. As described above, imaging pixel values 324 can include, but are not limited to, data specifying values of luminance (or color components) measured by the photodiode associated with each of imaging pixels 102 in sensor array 100. Further, in some examples, sensor array 100 may include one or more sparsely distributed pairs of left and right PD pixels, and PD pixel values 326 can include, but is not limited to, values of luminance measured by the photodiode associated with each of the left and right PD pixels in sensor array 100. In some instances, the luminance or color component values measured by the left and right PD pixels within each PD pixel pair can represent corresponding left and right PD pixel values usable in conjunction with certain "center pixel" values associated with each pixel in a sensor array row having at least one PD pixel to determine a phase difference (also referred to as phase disparity) during extended- or full-density PDAF control processing, as described below. The "center pixel" value associated with a given imaging pixel or PD pixel can be measured by the given pixel or interpolated from values measured by at least two nearby pixels.

"Center" pixel data 318 can include luminance and/or color component values (e.g., center pixel values) associated with each pair of PD pixels within sensor array 100, and each imaging pixel disposed within a sensor-array row that includes a pair of PD pixels. The center pixel data 318 are used for PDAF control processing.

Difference data 320 can include phase difference information for each pair of left and right PD pixels, and data characterizing a left, right, and center image, as described in greater detail below. PDAF data 322 can include other data used in PDAF control processing.

Instructions 306 can include, but are not limited to, a sampling block 328 for controlling capture of sensor data, a phase-detection autofocus (PDAF) block 330 for automatically determining a lens alignment or position adjustment based on phase offset, and a control block 332 which issues commands to the image capture hardware 310. Additionally, as illustrated in FIG. 3, PDAF block 330 can include additional instructions, such as center pixel block 334, phase detection offset block 336, and phase detection correlation block 338. The various components of instructions block 306 are described in greater detail below.

Center pixel block 334 determines a measured or interpolated value for one or more PD pixels and imaging pixel of a sensor-array row. For example, a center pixel value at the location of a green PD pixel can be determined by interpolating between the values of the nearest green imaging pixels above and below the green PD pixel in the same column as the green PD pixel. A center pixel value at the location of a selected green imaging pixel in a given row and column can be determined by interpolating between the values of the two nearest green imaging pixels in rows above and below the given row containing the selected green imaging pixel, in the same column as the selected green imaging pixel. Alternatively, the measured value at the location of the selected green imaging pixel can be used directly as the center pixel value for the location of the selected green imaging pixel.

As another example, a center pixel value at the location of a red (or blue) imaging pixel can be determined by interpolating between the values of the two nearest green imaging pixels above and below the red (or blue) imaging pixel in the same column as the red (or blue) imaging pixel. In further examples, a center pixel value at the location of a filterless PD pixel (e.g., a PD pixel that omits a color filter or other filtering layer) can be determined by interpolating between the values of neighboring red, green, and blue imaging pixels disposed proximate to the filterless PD pixel within the sensor array. For instance, as described below, these neighboring imaging pixels can include, but are not limited to, the nearest red, green or blue imaging pixels in the same column and same row as the filterless PD pixel, and additional red, green, or blue imaging pixels disposed in rows or columns adjacent to the row and column that include the filterless PD pixel.

In some implementations, the determined luminance and/or color component values may establish a center pixel line having an "extended horizontal density." For example, as used herein, a center pixel line having an extended horizontal density includes, for a sensor-array row having at least one PD pixel, center pixel values interpolated at the positions of each PD pixel (e.g., the positions of each left and right PD pixel) along with center pixel values measured or interpolated at the locations of a subset of the imaging pixels in the sensor-array row, e.g., imaging pixels 102 (FIG. 1E). The subset of the imaging pixels includes two or more imaging pixels in the sensor array row. The values associated with each of the two or more imaging pixels can be measured values or interpolated values based on values measured by pixels in adjacent or nearby rows of pixels.

By way of example, and in reference to FIG. 1E, sensor-array row 122 of sensor array 100 includes left PD pixel 112A and right PD pixel 112B, and sensor-array row 124 of sensor array 100 includes left PD pixel 114A and right PD pixel 114B. In some instances, center pixel lines representative of sensor-array rows 122 and 124 at extended horizontal density include not only interpolated values of center pixels at the locations of each of left PD pixel 112A, right PD pixel 112B, left PD pixel 114A, and right PD pixel 114B, but also values of center pixels interpolated or measured at the locations of subsets of the additional imaging pixels (e.g., imaging pixels 102) disposed within sensor-array rows 122 and 124. For instance, the center pixel lines at extended horizontal density can include values of center pixels interpolated at the locations of each green imaging pixel in the array rows 122 and 124, in addition to the locations of the PD pixels. In another example, the center pixel lines at extended horizontal density can include values of center pixels interpolated at the locations of each red imaging pixel in the array rows 122 and 124. In other examples, the center pixel lines at extended horizontal density can include values of center pixels interpolated (or measured) at locations of a subset of the red, green, and/or blue imaging pixels within each of sensor-array rows 122 and 124. The exemplary rows 122 and 124 are red-green rows. In other embodiments, the PD pixels can be located in green-blue rows. The center pixel lines at extended horizontal density can include, but are not limited to, the values of center pixels interpolated at the locations of red and blue imaging pixel (e.g., denoted by "R" and "B" in FIG. 1E) within sensor-array rows 122 and 124 (and exclude values of center pixels measured or interpolated at the location of each green imaging pixel).

As a further example, the determined luminance and/or color component values may establish the center pixel line at "full horizontal density." As used herein, a center pixel line having full horizontal density includes, for a sensor-array row having at least one PD pixel, center pixel values interpolated at the positions of each PD pixel (e.g., the positions of each left and/or right PD pixel) along with center pixel values measured or interpolated at the locations of each imaging pixel in the sensor-array row, e.g., imaging pixels 102 (FIG. 1E). For example, and in reference to FIG. 1E, center pixel lines representative of sensor-array rows 122 and 124 at full horizontal density include not only interpolated values of center pixels at the locations of each of left PD pixel 112A, right PD pixel 112B, left PD pixel 114A, and right PD pixel 114B, but also values of center pixels interpolated or measured at the locations of each additional imaging pixel (e.g., imaging pixels 102) disposed within sensor-array rows 122 and 124.

Further, and in addition to the interpolated or measured center pixel values, center pixel data 318 (FIG. 3) may also include data associating each of the center pixel values with a corresponding pixel location within sensor array 100. For example, each of the center pixel values can be associated with sensor-array row and column indices for the corresponding imaging or PD pixel.

Difference data 320 can include calculated values indicative of a sum of absolute differences (e.g., SAD values) which are determined based on center pixel values interpolated at locations of each pair of PD pixels within sensor array 100, as well as additional center pixel values measured or interpolated at locations of each imaging pixel disposed in a sensor-array row that includes a pair of PD pixels. By way of example, as described below, difference data 320 can include: (i) first SAD values calculated based on comparisons between the measured left PD pixel values and corresponding ones of the measured or interpolated center pixel values (summed over pixel positions in a row having a left PD pixel); and (ii) second SAD values calculated based on comparisons between the measured right PD pixel values and corresponding ones of the measured or interpolated center pixel values (summed over pixel positions in a row having a right PD pixel). Further, in some instances, the first SAD values can collectively establish a first SAD vector that reflects the comparison of the left PD pixel values and the corresponding center pixel values, and the second SAD values can collectively establish a second SAD vector that reflects the comparison of the right PD pixel values and the corresponding center pixel values.

In other examples, difference data 320 can also include values indicative of a sum of the squared differences (SSD) between the measured left or right PD pixel values and corresponding ones of the measured or interpolated center pixel values (e.g., SSD values that collectively establish an SSD vector), or values calculated based on an application of other image registration processes to the left or right PD pixel values and corresponding ones of the measured or interpolated center pixel values.

In some examples, PDAF data 322 can include elements of data that support a performance of one or more of the exemplary extended-density and full-density PDAF control processes described below. For example, PDAF data may include raw pixel data used in an autofocus operation before image capture. PDAF data may also include information that supports an interpolation of certain center pixel values based on luminance or color component values measured by adjacently disposed imaging pixels. PDAF data may also include information that supports a cross-correlation, interpolation, or convolution of portions of difference data 320 (e.g., the components of the SAD vector, the components of the SSD vector, etc.) to determine an optimal correlation point between the pixel-value offsets at each PD pixel pair and thus, a phase difference between the PD pixel pairs, as described in greater detail below. In further examples, PDAF data may include information that facilitates a determination of an autofocus adjustment to components of optical assembly 312 that corrects the defocus condition and a generation of a lens position command signal that causes motors or actuators 314 to implement the determined autofocus adjustment.

To facilitate understanding of the examples, instructions 306 are in some cases described in terms of one or more blocks configured to perform particular operations. As illustrated in FIG. 3, instructions 306 can include, but are not limited to, a sampling block 328, a phase-detection autofocus (PDAF) block 330, and a control block 332. Additionally, and as illustrated in FIG. 3, PDAF block 330 can include additional instructions, such as center pixel block 334, phase detection offset block 336, and phase detection correlation block 338.

Sampling block 328 provides a means for receiving luminance data from the plurality of sensing elements in the sensor array 100, the sensing elements comprising imaging pixels 102 and PD pixels 112A, 112B, 114A, 114B of FIGS. 1A-1E. The luminance data comprises luminance values measured by the imaging pixels and the PD pixels. By way of example, sampling block 328 can receive, from sensor array 100, values of luminance (or color components) measured by corresponding ones of the imaging and PD pixels within sensor array 100. As described above, the luminance or color component values can be representative of the light collected by each of imaging pixels 102, left PD pixels 112A and 114A, and right PD pixels 112B and 114B (and any additional or alternative numbers of imaging or PD pixels within sensor array 100). The collected light can be filtered by one or more filters, such as color filter 136, and subsets of the imaging pixels and PD pixels can measure luminance or color component values indicative of an intensity of visible red, green, and blue light collected by the corresponding photodiodes. In other instances, the one or more filters can be configured to admit light having non-visible wavelengths (e.g., ultraviolet or infrared light), and one or more of the imaging or PD pixels can be configured to measure luminance values indicative of an intensity of the collected non-visible light. Further, one or more of the imaging or PD pixels can omit the color filter, and can be configured to measure an intensity of collected light regardless of its wavelength.

Sampling block 328 can also perform operations that store the received luminance or color component values within a corresponding portion of database 304, e.g., sensor data 316. For instance, sampling block 328 can store luminance or color component values measured by imaging pixels 102 within image pixel values 324, and can store luminance or color component values measured by the PD pixels within PD pixel values 326. Further, and in addition to the received luminance or color component values, sampling block 328 can also store pixel data characterizing the imaging or PD pixel that measured each of the luminance or color component values within corresponding portions of imaging pixel values 324 or PD pixel values 326. Examples of the pixel data include, but are not limited to, a pixel location within sensor array 100 (e.g., in a corresponding sensor-array row and column) and filter data characterizing a filter included or excluded within the corresponding imaging or PD pixel (e.g., a red, green, or blue color filter, or a lack of a filter). Further, sampling block 328 can perform operations that initiate execution of one or more of instructions 306, such as PDAF block 330 or control block 332, based on commands provided through a corresponding program interface. Examples of the corresponding program interface include, but are not limited to, an application programming interface (API) associated with PDAF block 330 or control block 332.

PDAF block 330 can process the received luminance or color component values to detect an occurrence of a defocus condition. PDAF block 330 provides a means for performing a phase-detection autofocus operation based on an outcome of a comparison between luminance values measured by each of the PD pixels 112A, 112B, 114A, 114B and luminance values associated with the imaging pixels 402-416 of FIG. 4A. For instance, the received luminance or color component values, e.g., as measured by sensor array 100, can correspond to image data characterizing a target scene. PDAF block 330 can perform operations that detect the occurrence of the defocus condition within at least a portion of the image data corresponding to a selected focus point. As described above, the defocus condition can correspond to a front-focus condition in which optical assembly 312 collimates and focuses light onto a plane disposed in front of sensor array 100, or alternatively, a back-focus condition in which optical assembly 312 collimates and focuses light onto a plane disposed behind of sensor array 100.

Further, PDAF block 330 can perform any of the exemplary extended-density or full-density PDAF control processes described herein to determine an autofocus adjustment (e.g., a modification to an alignment or a positioning of one or more components of optical assembly 312) that corrects the detected defocus condition and bring the region(s) of interest within the target scene corresponding to the selected focus point(s) into focus. In one instance, PDAF block 330 may perform one or more of the exemplary PDAF control processes at full horizontal density based on the luminance or color component value measured by sensor array 100, which includes sparsely distributed pairs of PD pixels interspersed among imaging pixels in repeating patterns. In some instances, an implementation of full-density PDAF control processes can reduce occurrences of errors related to random noise and aliasing with phase-detection offset data generated by sparse PDAF control processing without increasing a density of the PD pixel pairs within sensor array 100.

To implement the exemplary full-density PDAF control processes described herein, a center pixel block 334 of PDAF block 330 can process the received values of luminance or color component, e.g., as measured by imaging and PD pixels within sensor array 100, to generate center pixel lines that characterize sensor array 100 at full horizontal density. As described herein, the center pixel line at full horizontal density includes, for a sensor-array row having at least one PD pixel, center pixel values interpolated at the positions of each PD pixel (e.g., the positions of each left and/or right PD pixel) along with measured or interpolated center pixel values at the locations of each additional imaging pixel, e.g., imaging pixels 102. Further, the center pixel line at extended horizontal density includes, for a sensor-array row having at least one PD pixel, center pixel values interpolated at the positions of each PD pixel along with measured or interpolated center pixel values at the locations of a subset of the additional imaging pixels, e.g., imaging pixels 102.

By way of example, and as illustrated in FIGS. 1A and 1E, left PD pixel 112A and right PD pixel 112B can be disposed within sensor-array row 122 of sensor array 100, and left PD pixel 114A and right PD pixel 114B can be disposed within sensor-array row 124 of sensor array 100. In some instances, center pixel block 334 can generate center pixel lines representative of sensor-array rows 122 and 124 at full horizontal density that includes: (i) interpolated values of center pixels at the locations of each of left PD pixel 112A, right PD pixel 112B, left PD pixel 114A, and right PD pixel 114B disposed within sensor-array rows 122 and 124; and (ii) interpolated or measured values of center pixels at the locations of each additional imaging pixel disposed within sensor-array rows 122 and 124.

In the example of FIG. 1E, the center pixels corresponding to PD pixels 112A, 112B, 114A and 114B are interpolated from the green pixels two rows above and two rows below the PD pixels. The center pixels corresponding to the remaining green pixels in the sensor-array rows 122 and 124 can be the measured green pixels in rows 122 and 124, or can be interpolated from the green pixels two rows above and two rows below the measured green pixels. The center pixels corresponding to the red pixels in sensor-array rows 122 and 124 can be interpolated from the green pixels one row above and one row below the red pixels.

Figure 4A:
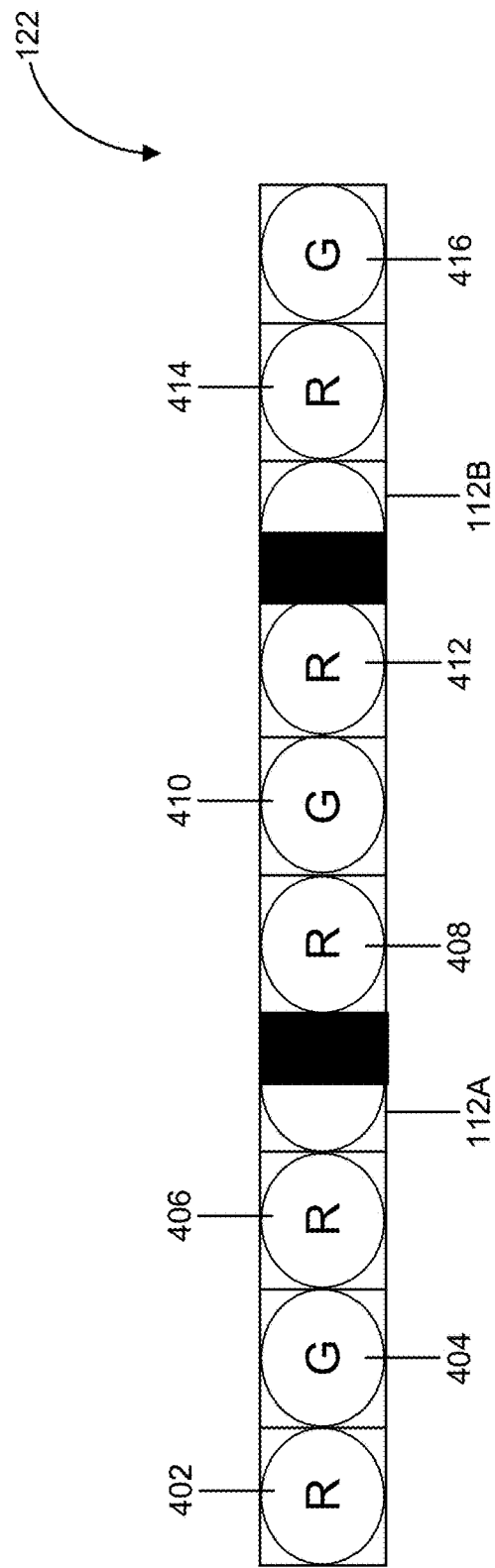

FIGS. 4A-4D are diagrams illustrating exemplary processes for computing a center pixel line at full horizontal density based on values of luminance or color component measured by portions of a sensor array, such as sensor array 100 of FIGS. 1A and 1E. As illustrated in FIG. 4A, sensor-array row 122 includes left PD pixel 112A and right PD pixel 112B, which collectively establish PD pixel pair 112, and plurality of imaging pixels 402-416. In other instances, not illustrated in FIG. 4A, sensor-array row 122 can include any additional or alternative number of PD pixel pairs, which can be sparsely distributed among any additional or alternative number of imaging pixels.

As described above, left PD pixel 112A and right PD pixel 112B may each include a mask layer that selectively shields and exposes portions of a corresponding photodiode. For example, left PD pixel 112A may include a mask layer (e.g., mask layer 144 of FIG. 1E) dimensioned and positioned to selectively shield a right-side portion of the corresponding photodiode (e.g., portion 146B of photodiode 146 of FIG. 1B), while exposing a left side portion of the photodiode to incident light (e.g., portion 146A of FIG. 1B). Similarly, and by way of example, right PD pixel 112B may include a mask layer (e.g., mask layer 164 of FIG. 1D) dimensioned and positioned to selectively shield a left-side portion of the corresponding photodiode (e.g., portion 166A of photodiode 166 of FIG. 1D), while exposing a right side portion of the photodiode to incident light (e.g., portion 166B of FIG. 1D). In some instances, the luminance or color component values measured by left PD pixel 112A can establish a left PD pixel value, and the luminance or color component values measured by right PD pixel 112B can establish a right PD pixel value, as described in greater detail below.

In some examples, each of imaging pixels 402-416 may include a corresponding color filter, such as color filter 136, configured to admit light having a specified range of wavelengths. For example, each of imaging pixels 402, 406, 408, 412, and 414 can include a color filter that admits light having a wavelength range characteristic of visible red light, e.g., wavelengths from 620-750 nm (and are denoted by a "R" in FIG. 4A). Further, each of imaging pixels 404, 410, and 416 can include a color filter that admits light having a wavelength range characteristic of visible green light, e.g., wavelengths from 485-570 nm (and are denoted by a "G" in FIG. 4A). Additionally, although not depicted in FIG. 4A, other imaging pixels within sensor array 100 can include a color filter that admits light having a wavelength range characteristic of visible blue light, e.g., wavelengths from 450-485 nm (and are denoted by a "B", as described below).

As described above, the imaging pixels (e.g., which include corresponding ones of red, green, and blue color filters) can be disposed within sensor array 100 in accordance with a Bayer pattern (shown in FIG. 1E). The arrangement of the imaging pixels within the Bayer pattern can, in some instances, establish alternating sensor-array rows that include alternating pairs of imaging pixels having red or green color filters (e.g., "R-G" rows) and that include alternating pairs of green and blue color filters (e.g., "G-B" rows). For example, in FIG. 4A, sensor-array row 122 can include imaging pixels having red or green color filters, and as such, sensor-array row 122 corresponds to an R-G row.

Figure 4B:
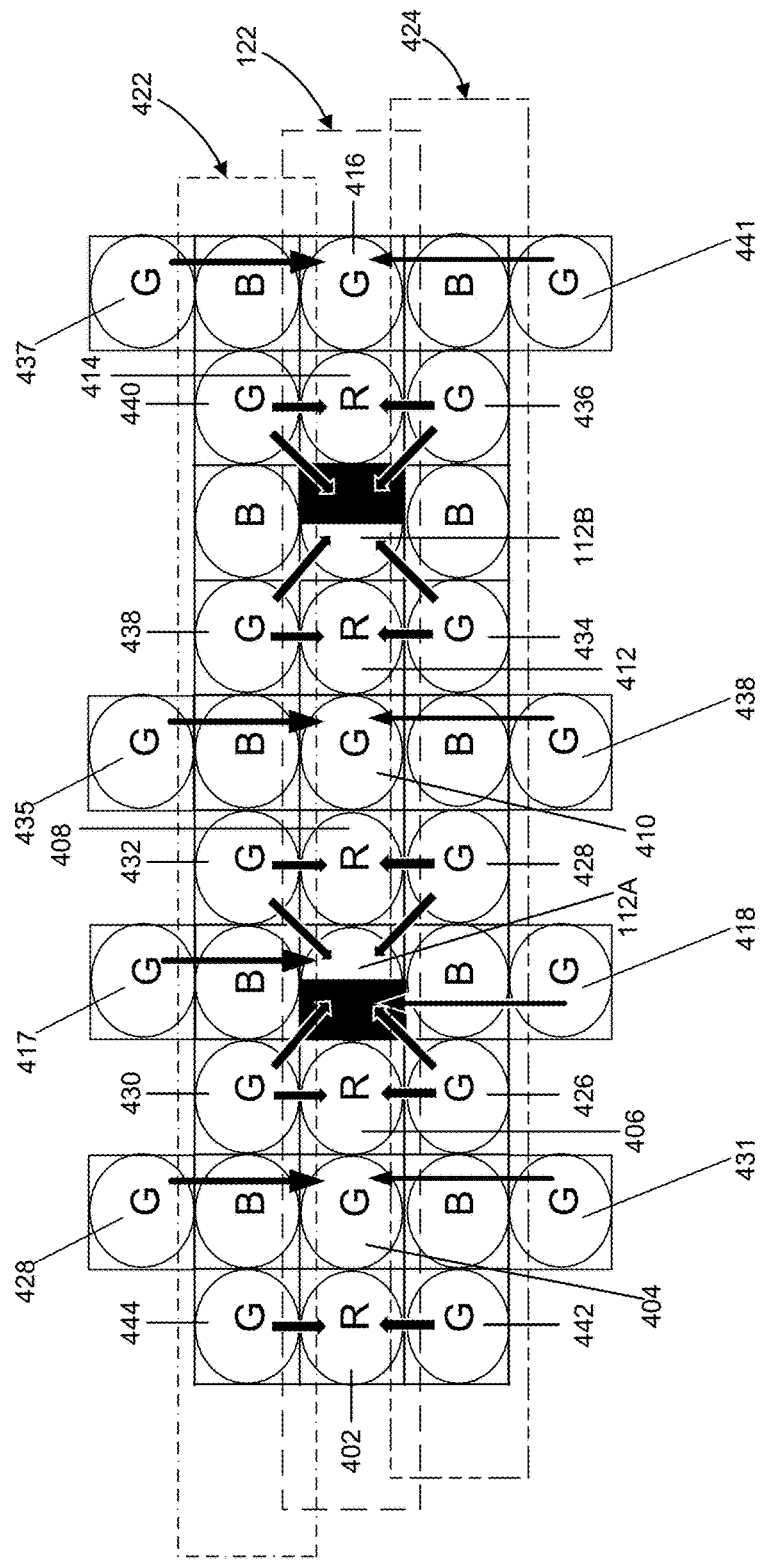

In some implementations, center pixel block 334 (FIG. 3) can calculate a center pixel value for left PD pixel 112A, right PD pixel 112B, and for one or more of imaging pixels 402-416 based on an interpolation of luminance or color component values measured by imaging pixels (e.g., imaging pixel values) disposed within sensor-array rows adjacent to sensor-array row 122 within sensor array 100. For example, as illustrated in FIG. 4B, sensor-array rows 422 and 424 are disposed adjacent to sensor-array row 122 within sensor array 100, and are populated with green and blue imaging pixels. Accordingly, in some instances, sensor-array rows 422 and 424 may both correspond to G-B rows within sensor array 100.

As illustrated in FIG. 4B, center pixel block 334 (FIG. 3) can calculate the center pixel values for left PD pixel 112A and right PD pixel 112B based on an interpolation of imaging pixel values measured by neighboring imaging pixels disposed on adjacent sensor-array rows 422 and 424. For example, left PD pixel 112A and right PD pixel 112B may be disposed at positions within sensor array 100 that, in accordance with the Bayer pattern, would otherwise be occupied by green imaging pixels (e.g., imaging pixels having color filters configured admit green visible light). As such, each of left PD pixel 112A and right PD pixel 112B may also include a green color filter and the luminance or color component values measured by left PD pixel 112A and right PD pixel 112B may be indicative of an intensity of visible green light collected by the corresponding photodiodes. In other embodiments, the PD pixels do not have color filters, and the center pixel values at the location of a PD pixel are interpolated from eight red, green, and blue pixels surrounding the PD pixel.

Referring to FIG. 4B, PDAF block 330 can calculate the center pixel value for left PD pixel 112A by applying one or more interpolation algorithms to the pixel values measured by diagonally adjacent imaging pixels 426, 428, 430, and 432. Similarly, center pixel block 334 (FIG. 3) can calculate the center pixel value for right PD pixel 112B by applying one or more of the interpolation algorithms to the pixel values measured by diagonally adjacent imaging pixels 434, 436, 438, and 440. Examples of the one or more interpolation algorithms include, but are not limited to, linear interpolation algorithms, bi-linear or bi-cubic interpolation algorithms, spline-based interpolation algorithms, or polynomial interpolation algorithms.

As described herein, each of diagonally adjacent imaging pixels 426, 428, 430, and 432 and diagonally adjacent imaging pixels 434, 436, 438, and 440 include color filters configured to admit green visible light (e.g., as denoted by "G" in FIG. 4B). In some instances, the interpolated center pixel values of left PD pixel 112A and right PD pixel 112B can approximate a luminance or color component value measurable by a corresponding green imaging pixel (e.g., that includes a green color filter) disposed within sensor array 100 at each of the locations of left PD pixel 112A and right PD pixel 112B. For example, in some embodiments, the value of the center pixel at the location of PD pixel 112A is interpolated as the arithmetic mean of the green pixel 417 two rows above PD pixel 112A and green pixel 418 two rows below PD pixel 112A. In other embodiments, the value of the center pixel at the location of PD pixel 112A is interpolated as the arithmetic mean of the four green pixels 426, 428, 430, and 432 diagonally surrounding PD pixel 112A. Alternatively, the value of the center pixel at the location of PD pixel 112A can be determined as the arithmetic mean of the green pixels 417, 418, 426, 428, 430, and 432.

Further, and to generate the center pixel line at full horizontal density, center pixel block 334 (FIG. 3) may perform additional operations that calculate or assign a center pixel value to each of imaging pixels 402-416 disposed within sensor-array row 122. As illustrated in FIG. 4B, imaging pixels 402, 406, 408, 412, and 416 include color filters configured to admit visible red light (e.g., as denoted by "R" in FIG. 4B). In some examples, center pixel block 334 can generate the center pixel values for these red imaging pixels based on an interpolation of pixel values measured by imaging pixels disposed in adjacent sensor-array rows 422 and 424 (e.g., green imaging pixels that include a color filter that admits green visible light, as denoted by "G" in FIG. 4B).

For instance, as illustrated in FIG. 4B, center pixel block 334 (FIG. 3) can generate the center pixel values for red imaging pixels 402 and 406 by applying any of the interpolation algorithms described above to pixel values measured by corresponding pairs of adjacent green imaging pixels 442 and 444 and adjacent green imaging pixels 426 and 430. Similarly, center pixel block 334 can also generate the center pixel values for red imaging pixels 408, 412, and 416 by applying any of the interpolation algorithms describe above to imaging pixel values measured by corresponding pairs of adjacent green imaging pixels 428 and 432, adjacent green imaging pixels 434 and 438, and adjacent green imaging pixels 436 and 440.

Further, imaging pixels 404, 410, and 416 correspond to green imaging pixels, and the luminance or color component values measured by imaging pixels 404, 410, and 416 characterize an intensity of green light collected by each of the corresponding photodiodes. In one example, center pixel block 334 can also establish the imaging pixel values for green imaging pixels 404, 410, and 416 by applying any of the interpolation algorithms described above to imaging pixel values measured by corresponding pairs of green imaging pixels two rows above green imaging pixels 404, 410, and 416 and two rows below green imaging pixels 404, 410, and 416, e.g., pairs of green imaging pixels 428 and 431, 435 and 438, and 437 and 441. In other examples, center pixel block 334 can establish the imaging pixel values measured by each of green imaging pixels 404, 410, and 416 as the center pixel values without interpolation.

In some instances, the pixel values measured by the imaging pixels within sensor-array rows 422 and 424 can suffer from image artifacts due to the proximity to left PD pixel 112A and right PD pixel 112B. To account for these image artifacts, center pixel block 334 (FIG. 3) can also calculate the center pixel values for left PD pixel 112A, right PD pixel 112B, or imaging pixels 402-416 based on an interpolation of imaging pixel values measured by imaging pixels disposed in additional sensor-array rows adjacent to sensor-array rows 422 and 424 within sensor array 100, or within additional sensor-array rows separated from sensor-array rows 422 and 424 within sensor array 100 by one or more sensor-array rows. Additionally, in other examples, center pixel block 334 can establish one or more imaging pixel values measured by the imaging pixels within sensor-array rows 422 or 424 as the center pixel values for corresponding ones of left PD pixel 112A, right PD pixel 112B, or imaging pixels 402-416, e.g., without interpolation.

In other examples, described below in reference to FIG. 4C, center pixel block 334 (FIG. 3) can calculate the center pixel values for each of the imaging and PD pixels within sensor-array row 122 based on pixel values measured by imaging pixels disposed within multiple sets of sensor-array rows disposed adjacent to sensor-array row 122 within sensor array 100. That is, every center pixel in sensor-array row is determined by combining values of at least two other pixels in the same column and in different rows from the center pixel. For example, as illustrated in FIG. 4C, sensor-array row 462 can be disposed adjacent to sensor-array row 422 in sensor array 100, and sensor-array row 464 can be disposed adjacent to sensor-array row 424 in sensor array 100. Further, each of the imaging pixels within sensor-array rows 462 and 464 may include color filters that admit red visible light (e.g., as denoted by "R") or that admit green visible light (e.g., as denoted by "G"), as such, each of sensor-array rows 462 and 464 correspond to R-G rows within sensor array 100.

As illustrated in FIG. 4C, center pixel block 334 (FIG. 3) can calculate the center pixel values for left PD pixel 112A and right PD pixel 112B based not only on pixel values measured by green imaging pixels disposed within adjacent sensor-array rows 422 and 424, but based on pixel values measured by green imaging pixels disposed within multiple pairs of adjacent sensor-array rows 422, 424, 462, and 464. For example, dashed line 466A can enclose a "neighborhood" 466 of imaging pixels disposed adjacent to left PD pixel 112A within sensor-array rows 422, 424, 462, and 464, and dashed line 468A can enclose a second pixel neighborhood 468 of imaging pixels disposed adjacent to right PD pixel 112B within sensor-array rows 422, 424, 462, and 464.

In some examples, pixel neighborhoods 466 and 468 may include any additional or alternative number of red, blue or green imaging pixels within sensor array 100. Further, although described in FIG. 4C as square arrays centered on corresponding one left PD pixel 112A and right PD pixel 112B, one or more of pixel neighborhoods 466 and 468 can include a rectangular array of imaging pixels that includes a corresponding left PD pixel 112A or right PD pixel 112B (e.g., 3×4 arrays, 5×6 arrays, etc.) or a columnar array that includes a corresponding left PD pixel 112A or right PD pixel 112B (e.g., a 5×1 array). Further, in some embodiments, neighborhoods 466 or 468 may include an equivalent number of green imaging pixels (or red or blue imaging pixels) drawn from each of the adjacent R-G and G-B rows included within pixel neighborhoods 466 or 468.

In some instances, to calculate the center pixel value for left PD pixel 112A, center pixel block 334 (FIG. 3) can apply any of the interpolation algorithms described above to the pixel values generated by the green imaging pixels disposed within pixel neighborhood 466 (e.g., twelve green imaging pixels, denoted by "G"). Similarly, to calculate the center pixel value for right PD pixel 112B, center pixel block 334 can apply any of the interpolation algorithms described above to the pixel values generated by the green imaging pixels disposed within pixel neighborhood 468 (e.g., the twelve green imaging pixels, denoted by "G"). Additionally, although not illustrated in FIG. 4C, center pixel block 334 may perform similar operations to establish an appropriate pixel neighborhood about each of red imaging pixels 402, 406, 408, 412, and 416 within sensor-array 122, and to calculate the center pixel value for each of red imaging pixels 402, 406, 408, 412, and 414 by applying any of the interpolation algorithms described above to the pixel values measured by the green imaging pixels within corresponding ones of the established pixel neighborhoods. Further, as described above, PDAF block 330 can establish the pixel values measured by each of green imaging pixels 404, 410, and 416 as the corresponding center pixel values without interpolation.

In the examples described above, center pixel block 334 (FIG. 3) can calculate center pixel values for each imaging and PD pixel within a sensor-array row of sensor array 100 based on pixel values of green imaging pixels within adjacent sensor-array rows (e.g., adjacent imaging pixels that include a color filter that admits visible green light). The use of green imaging pixels, as described herein, is suitable for full-density PDAF control processing of captured image data associated with many target scenes, as there are twice as many green pixels surrounding any green pixel as there are red pixels or blue pixels. A full sensor-array row of green pixels can be calculated with fewer interpolations than a sensor-array row of red pixels or sensor-array row of blue pixels. Also, the wavelength range associated with visible green light (e.g., 485-570 nm) is sufficiently broad to establish its measured luminance or color component as an accurate measure of the luminance or color component of any visible light. In some instances, and for certain target scenes, a preponderance of certain wavelengths within the light collected by sensor array 100 can indicate an unsuitability of green imaging pixels (and the corresponding measured pixel values) for full-density PDAF control processing. For example, sensor array 100 may collect visible blue light characterizing an edge of a particular target scene, and center pixel block 334 (FIG. 3) may perform any of the exemplary processes described above to calculate the center pixel values based not on interpolated pixel values measured by green imaging pixels within the adjacent sensor-array rows (e.g., sensor-array rows 422, 424, 462, or 464, as described above), but on interpolated pixel values measured by blue imaging pixels disposed within the adjacent sensor-array rows.

In other examples, center pixel block 334 (FIG. 3) can perform operations that compute a center pixel value for left PD pixel 112A, right PD pixel 112B, and imaging pixels 402-416 within sensor-array row 122 based on an interpolation of pixel values measured by adjacent red, green, and blue imaging pixels (e.g., as a part of one or more mosaicing processes). As described herein, imaging pixel within sensor array 100 is defined as a red, green, or blue imaging pixel based on the inclusion of a color filter configured to selectively admit corresponding ones of visible red light, visible blue light, or visible green light. Under certain sampling conditions, such as low-light conditions, the calculation of the center pixel values based on pixel values measured by neighboring red, green, and blue imaging pixels, can generate more robust center pixel values that improve the performance of the full-density PDAF control processes described herein and further reduce errors resulting from processing-induced noise.

Further, and as described above, left PD pixel 112A and right PD pixel 112B (and other PD pixels within sensor array 100) can omit a color filter or other filtering layer. In some examples, center pixel block 334 can perform operations that compute the center pixel values at the locations of these filterless PD pixels (e.g., left PD pixel 112A and right PD pixel 112B within sensor array 100) can be determined based on an interpolation between the values measured by the red, green, and blue imaging pixels disposed adjacent or proximate to left PD pixel 112A and right PD pixel 112B, as described below.

For example, as illustrated in FIG. 4D, center pixel block 334 (FIG. 3) may establish a pixel neighborhood 470, which is centered on left PD pixel 112A and that includes red, green, and blue imaging pixels (e.g., as denoted by "R," "G," and "B," respectively). Center pixel block 334 may also establish an additional pixel neighborhood 472, which is centered on right PD pixel 112B and that includes red, green, and blue imaging pixels (e.g., as denoted by "R," "G," and "B," respectively). In some instances, center pixel block 334 may calculate: (i) the center pixel value for left PD pixel 112A by applying any of the interpolation algorithms described above to the pixel values measured by the red, green, and blue imaging pixels within neighborhood 470; and (ii) the center pixel value for right PD pixel 112B by applying any of the interpolation algorithms described above to the pixel values measured by the red, green, and blue imaging pixels within neighborhood 472.

In some instances, within the interpolation process, center pixel block 334 (FIG. 3) may apply weight factors to the pixel values measured by certain of the red, green, or blue imaging pixels. For example, under certain conditions, center pixel block 334 may apply a weight factor to the pixel values measured by the green imaging pixels to bias the interpolation of the center pixel line toward a measured output of the green imaging pixels. In other examples, additional or alternative weight factors can be applied to the pixel values measured by the red imaging pixels, or to the blue imaging pixels, to bias the interpolation process towards a measured output of the red or blue imaging pixels. One or more of the weight factors can be predetermined and stored within a corresponding portion of database 304, e.g., within PDAF data 322, or can be computed by center pixel block 334 adaptively and based on detected changes in certain operating or computational conditions.

Further, although not illustrated in FIG. 4D, center pixel block 334 (FIG. 3) can perform any of the processes described above to calculate center pixel values for imaging pixels 402-416 within sensor-array row 122 based on an interpolation of pixel values measured by adjacent red, green, and blue imaging pixels. For example, for each of imaging pixels 402-416 within sensor-array row 122, center pixel block 334 can perform any of the processes described above to establish an appropriate neighborhood of adjacent red, green, and blue imaging pixels, to access pixel values measured by these red, green, and blue imaging pixels, and to interpolate a corresponding center pixel value based on the measured pixel values (e.g., with or without the application of one or more weight factors).

As illustrated in FIG. 4D, pixel neighborhoods 470 and 472 can include adjacent red, green, and blue imaging pixels disposed in sensor-array row 122, and further, within adjacent sensor-array rows 422 and 424. In other examples, not illustrated in FIG. 4D, neighborhoods 470 and 472 can include red, green, or blue imaging pixels disposed within any number of additional or alternative adjacent sensor-array rows, such as, but not limited to, adjacent sensor-array rows 462 and 464 (FIG. 4C) described above. Further, although described in FIG. 4D as square arrays centered on corresponding ones of left PD pixel 112A and right PD pixel 112B, one or more of pixel neighborhoods 470 and 472 can include a rectangular array of imaging pixels that includes a corresponding left PD pixel 112A or right PD pixel 112B (e.g., 3×4 arrays, 5×6 arrays, etc.) or a columnar array that includes a corresponding left PD pixel 112A or right PD pixel 112B (e.g., a 5×1 array). In some embodiments the center pixel line for all pixel positions are provided by averaging the values of pixels found in lines above and below the line of the PD pixels. That is, interpolated center pixel values are used, without any measured center pixel values. In some instances, interpolating all of the positions in the center pixel line may avoid artifacts in pixel data from pixel positions adjacent to the PD pixels.

In other instances, one or more of the PD pixel pairs sparsely distributed within sensor array 100 may not include a color filter, e.g., color filter 136, or may incorporate a clear filter that is transparent to light (e.g., described herein as a "clear" PD pixel pair). The center pixel values for these clear PD pixel pairs, as calculated based on the interpolation of pixel values measured by adjacent green imaging pixels, may differ substantially from the output of a corresponding clear imaging pixel, if disposed at the locations of the clear PD pixel pairs within sensor array 100. To better approximate the output of a corresponding clear imaging pixel, center pixel block 334 (FIG. 3) may perform any of the exemplary processes described above (e.g., in reference to FIG. 4D) to establish neighborhoods of imaging pixels adjacent to the clear PD pixel pairs, and to calculate the center pixel values for the clear PD pixel pairs based on an interpolation of pixel values measured by the imaging pixels within the established neighborhoods.

As described above, the established neighborhoods of adjacent pixels can include, but are not limited to, red, green, and blue imaging pixels arranged in a corresponding pattern, such as a Bayer pattern. In other instances, the established neighborhoods of adjacent pixels can include one or more filterless imaging pixels (e.g., imaging pixels that include a clear filter or that do not include a color filter), either exclusively or in combination with one or more red, green, or blue pixels. Center pixel block 334 can perform any of the processes described herein to compute the center pixel values for left PD pixel 112A and right PD pixel 112B (and the other imaging pixels within sensor-array row 122) based on imaging pixel values measured by the adjacent neighborhoods of red, green, blue, or filterless imaging pixels.

In the examples described above, center pixel block 334 can compute, for one or more of the sensor-array rows that include a left or right PD pixel, a center pixel line at full horizontal density. For instance, as illustrated schematically in FIG. 4E, a center pixel line 482 representative of sensor-array row 122 at full horizontal density include not only interpolated values of center pixels at the locations of each of left PD pixel 112A and right PD pixel 112B (e.g., denoted by "$C_{PD}$" in FIG. 4E), but also values of center pixels interpolated or measured at the locations of additional imaging pixels 402-416 disposed within sensor-array row 122 (e.g., denoted by "$C_{IMG}$" in FIG. 4E).

In other examples, as described herein, center pixel block 334 can compute a center pixel line at extended horizontal density for one or more of the sensor-array rows that include a left or right PD pixel. As schematically illustrated in FIG. 4F, a center pixel line 484 representative of sensor-array row 122 at extended horizontal density include interpolated values of center pixels at the locations of each of left PD pixel 112A and right PD pixel 112B, and further, values of center pixels interpolated or measured at the locations of a first subset of additional imaging pixels 402-416 disposed within sensor-array row 122. For instance, in FIG. 4F, the first subset of additional imaging pixels 402-416 can include the green imaging pixels within sensor-array row 122 (e.g., green imaging pixels 404, 410, and 416), and center pixel block 416 can establish the center pixel values for green imaging pixels 404, 410, and 416 using any of the processes described above. In other instances (not illustrated in FIG. 4F), the first subset of additional imaging pixels can include, but is not limited to, one or more of the red imaging pixels within sensor array 122 (e.g., red imaging pixels 402, 406, 408, 412, or 414), one or more blue imaging pixels, or combinations or the red and green (or blue) imaging pixels.

As described above, center pixel block 334 can store the interpolated or measured center pixel values, which collectively establish each of the computed center pixel lines at full horizontal density (FIG. 4E) or extended horizontal density (FIG. 4F) within a portion of database 304, e.g., center pixel data 318. Additionally, in some instances, center pixel block 334 can also store data associating each of the center pixel values with a corresponding pixel location in sensor array 100 (e.g., the corresponding left PD pixels, right PD pixels, or imaging pixels) within center pixel data 318.

Figure 5A:
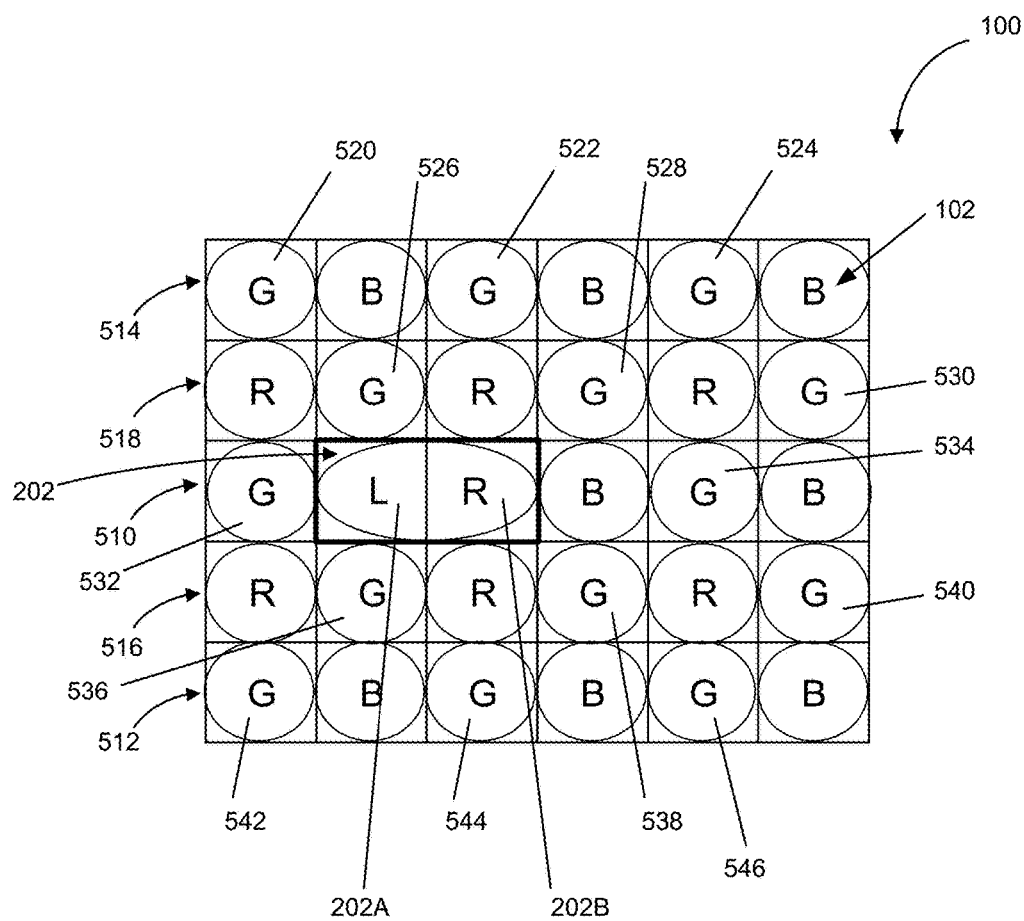
Figure 5B:
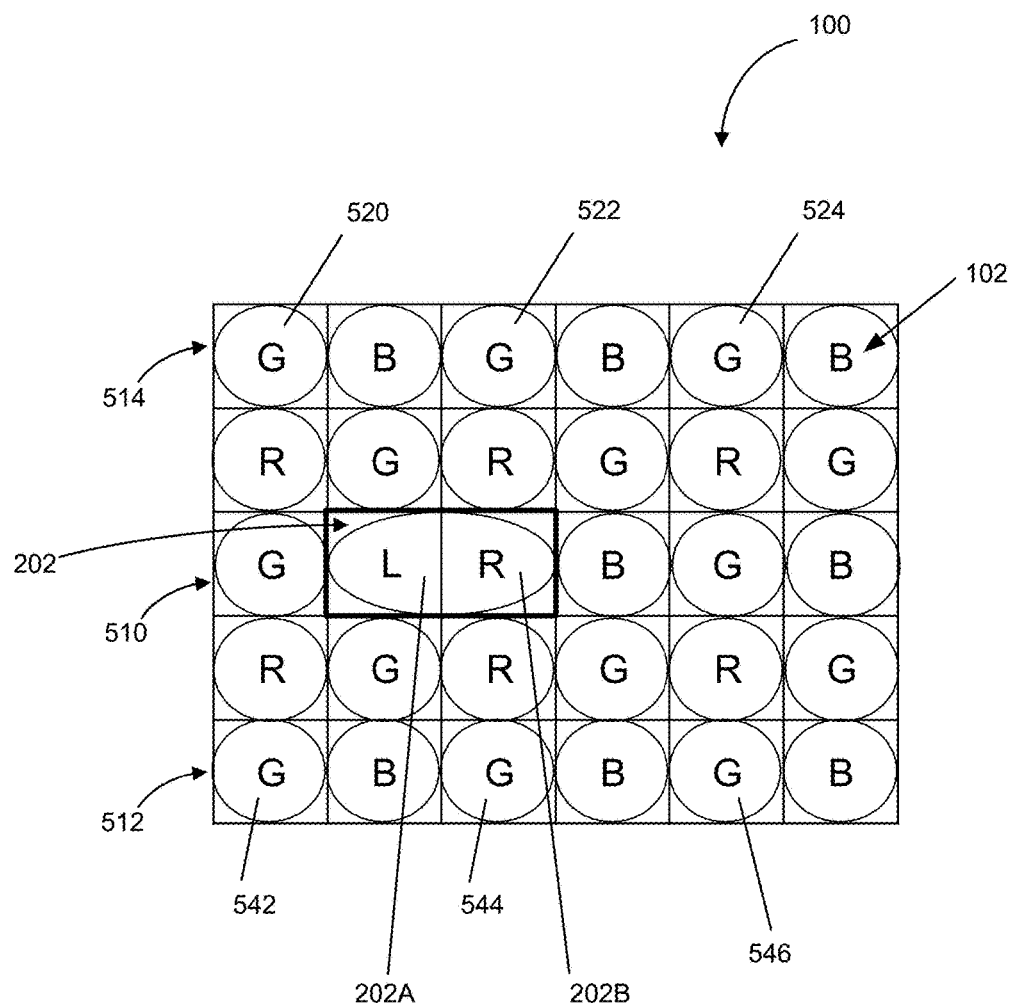

As described above, pairs of phase-detection (PD) pixels can be generated by selectively masking photodiodes included within corresponding pairs of pixels, such as PD pixel pairs 112 and 114 of FIG. 1A. In other examples, sparsely distributed pairs of PD pixels can be established within sensor array 100 based on a selective positioning of a single microlens structure (e.g., an elongated, oval-shaped microlens) over components of corresponding pairs of adjacent imaging pixels within a sensor array. FIGS. 5A-5B are diagrams illustrating additional processes performed by center pixel block 334 (FIG. 3) for computing a center pixel value of a PD pixel pair established by the selective positioning of an oval microlens over a pair of adjacent imaging pixels.

For example, as illustrated in FIGS. 5A-5B, a sensor array, e.g., sensor array 100, can include a plurality of imaging pixels, shown generally at 102. In some instances, and as described above, each of imaging pixels 102 can include a filter, such as a color filter configured to selectively admit visible red light (e.g., a red color filter), visible green light (e.g., a green color filter), or visible blue light (e.g., a blue color filter). Further, subsets of imaging pixels 102 can include red, green, or blue color filters (e.g., described herein as red, green, or blue imaging pixels and denoted by corresponding ones of "R," "G," and "B" in FIGS. 6A-6B), and red, green, and blue imaging pixels can be arranged in sensor array 100 in accordance with a particular pattern, such as a Bayer pattern.

Additionally, as described above, sensor array 100 can also include PD pixel pair 202 established by a selective positioning of an elongated, oval-shaped microlens over components of adjacent imaging pixels to establish PD pixel pair 202 including a left (L) PD pixel 202A and a right (R) PD pixel 202B. The left PD pixel 202A and a right PD pixel 202B can have the same color filter. For example, the left PD pixel 202A and a right PD pixel 202B can both have green color filters. Further, PD pixel pair 202 can be disposed within a corresponding sensor-array row 510 of sensor array 100, along with additional ones of red, green, and blue imaging pixels (e.g., arranged in the Bayer pattern). In some instances, center pixel block 334 (FIG. 3) can generate portions of center pixel lines representative of sensor-array rows 510 that includes: (i) interpolated values of center pixels at the location of PD pixel 202A, 202B; and (ii) values of center pixels interpolated or measured at the locations of each additional imaging pixel (e.g., imaging pixels 102) disposed within sensor-array row 510.

As illustrated in FIG. 5A, center pixel block 334 (FIG. 3) can calculate a single center pixel value for PD pixel 202 based on an interpolation of imaging pixel values measured by neighboring imaging pixels disposed on adjacent sensor-array rows 512, 514, 516, and 518 and additionally or alternatively, certain imaging pixels disposed adjacent to PD pixel pair 202 within sensor-array row 510. For instance, center pixel block 334 may identify, within sensor array 100, a plurality of green imaging pixels disposed proximate to PD pixel pair 202 along adjacent sensor-array rows 512, 514, 516, and 518, and further, along sensor-array row 510. These green imaging pixels include, but are not limited to, fourteen green imaging pixels, e.g., green imaging pixels 520-546 of FIG. 5A. In some examples, center pixel block 334 can calculate the center pixel value for PD pixel pair 202 by applying any of the interpolation algorithms described above to the identified green imaging pixels 520-546. Center pixel block 334 can also perform operations that assign the calculated center pixel value to each of left PD pixel 202A and right PD pixel 202B.

In further examples, center pixel block 334 (FIG. 3) can interpolate the center pixel value for PD pixel pair 202 based on any additional or alternative number of green imaging pixels, which may be disposed within sensor-array row 510 or within any additional or alternative number of sensor-array rows within sensor array 100 that are adjacent to sensor-array row 510. For instance, as illustrated in FIG. 5B, center pixel block 334 (FIG. 3) may calculate the center pixel value for PD pixel pair 202 (and thus, for left PD pixel 202A and right PD pixel 202B) based on a subset of the green imaging pixels, such as, but not limited to, green imaging pixels 520, 522, 524 disposed within sensor-array row 514 and green imaging pixels 542, 544, 546 disposed within sensor-array row 512.

Center pixel block 334 can further perform these exemplary processes to interpolate a center pixel value for each additional PD pixel (e.g., as established by a single microlens positioned over a pair of adjacent imaging pixels) within each sensor-array row of sensor array 100. Further, although not depicted in FIG. 6A or 6B, center pixel block 334 (FIG. 3) can perform any of the exemplary processes described herein to calculate, based on pixel values measured by adjacent imaging pixels, a center pixel value for each imaging pixel disposed within sensor-array row 510 (e.g., which includes PD pixel pair 202) and for each additional imaging pixel disposed within any additional or alternative sensor-array row that includes a PD pixel.

Referring back to FIG. 3, and through the exemplary processes described herein, center pixel block 334 of PDAF block 330 can generate a center pixel value for each PD pixel within sensor array 100 and imaging pixels disposed along a sensor-array row of sensor array 100 that includes a left or right PD pixel. Center pixel block 334 can perform additional operations that store the calculated center pixel values within a corresponding portion of database 304, e.g., within center pixel data 318, along with additional data that associates the center pixel values within corresponding positions within sensor array 100 (e.g., row and column data, imaging or PD pixel data, such as color filter identifiers, etc.). In some examples, the generated center pixel values can establish a center pixel line at full horizontal density (i.e., every column in the sensor-array row has a respective center pixel, determined by a combination of measured and interpolated pixel values) or at extended horizontal density (e.g., center pixel values are generated for a subset of the columns in the sensor-array row).

As described below, the generated center pixel lines can, at extended or full horizontal density, facilitate a comparison of and correlation between combinations of derived center images and measured left and right images at discrete positions along the sensor-array rows that include the PD pixels, in addition to the locations of the PD pixels. These comparisons can, in some examples, facilitate an extended- or full-density PDAF control processing of the sampled image data using a sparse distribution of PD pixels within sensor array 100, and can reduce occurrences of errors related to random noise and aliasing without increasing a density of the PD pixels within sensor array 100.

To further implement the exemplary extended- or full-density PDAF control processes described herein, a phase detection offset block 336 of PDAF block 330 (both shown in FIG. 3) can perform operations that process the obtained or computed center pixel values, left pixel values, and right pixel values and generate data characterizing a center image, a left image, and a right image. Phase detection offset block 336 can also perform operations that store the center image data, the left image data, and the right image data within a portion of database 304, e.g., within offset data (e.g., difference data 320).

In some instances, the center image data can include center pixel values interpolated at locations of each PD pixel within sensor array 100, and additional center pixel values interpolated or measured at locations of imaging pixels disposed along each sensor-array row that includes at least one PD pixel. By way of example, for a sensor-array row that include at least one PD pixel, the center pixel values can establish a center pixel line at extended horizontal density (e.g., based on center pixel values interpolated at the location of each PD pixel and interpolated or measured at locations of a subset of the imaging pixels) or at full horizontal density (e.g., based on center pixel values interpolated at the location of each PD pixel and interpolated or measured at locations of each of the imaging pixels). The center image data can also associate each of the center pixel values with a location of a corresponding PD pixel or imaging pixel within sensor array 100.

Further, the left image data can include left PD pixel values measured at a location of left PD pixel within sensor array 100, and right image data can include right PD pixel values measured at a location of each right PD pixel within sensor array 100. The data characterizing the left and right image can also associate respective ones of the measured left PD pixel values and the measured right PD pixel values with corresponding PD pixel locations within sensor array 100.

In additional examples, phase detection offset block 336 can further process the center image, the left image, and the right image to generate values indicative of differences (or offsets) between one or more of: (i) the left and center images; and (ii) the center and right images. For instance, phase detection offset block 336 can generate components of: (i) a first sum of the absolute differences (SAD) vector based on the data characterizing the differences or offsets between the left and center images, and (ii) a second SAD vector based on the data characterizing the differences or offsets between the center and right images. As described above, phase detection offset block 336 can perform additional operations that store the generated components of the first and second SAD vectors within database 304, e.g., within difference data 320.

As described above, the left and right PD pixels are distributed within sensor array 100 in accordance with a sparse pattern, and corresponding PD pixels (e.g., left and/or right PD pixels that may establish a PD pixel pair) can be separated within each sensor-array row of sensor array 100 by a fixed or varying number of imaging pixels. Due to the sparseness of the PD pixels within each of the sensor-array rows, the left and right image data can be characterized by a pixel-value resolution (e.g., of measured PD pixel values) that is smaller than a corresponding pixel-value resolution within the center image data (e.g., of center pixel values). In some implementations, to address these differences in pixel-value resolution, phase detection offset block 336 (FIG. 3) can perform operations that "upscale" the left and right image data to a pixel-value resolution consistent with the pixel-value resolution of the center image data (e.g., including center pixel lines having extended- or full-horizontal density).

For example, phase detection offset block 336 (FIG. 3) can introduce placeholder values (e.g., "holes") into the left image data to establish the values of imaging pixels or right PD pixels that separate the left PD pixels within each sensor-array row, and additional placeholder values into the right image data to represent values of the imaging or left PD pixels that separate the right PD pixels within each sensor-array row. In further examples, phase detection offset block 336 can assign a reference pixel value (e.g., a zero value, etc.) to each of the placeholder values to represent a missing pixel value in the right or left image data, which establishes augmented left and right image data at a pixel-value resolution consistent with the center image data. Phase detection offset block 336 can perform additional operations that store the augmented left and right image data within a corresponding portion of database 304, e.g., within difference data 320.

Phase detection offset block 336 (FIG. 3) can further process the center image data and the augmented left image data to determine the values indicative of the differences or offsets between the left and center images, and to generate the components of the first SAD vector based on the determined differences or offsets between the left and center images. For example, phase detection offset block 336 can access portions of the center image data and the augmented left image data that correspond to a particular sensor-array row within sensor array 100 (e.g., within difference data 320). As described above, the accessed portion of the augmented left image data can include the left PD pixel values measured at each left PD pixel within the particular sensor-array row, reference pixel values corresponding to the imaging or right PD pixels disposed within the particular sensor-array row, and data identifying a location of each left PD pixel within the particular sensor-array row (e.g., a row and column index within sensor array 100). Further, the accessed portion of the center image data can include the interpolated center pixel values that establish the corresponding center pixel line at extended- or full horizontal density, and the data identifying a pixel location associated with each interpolated center pixel value within the particular sensor-array row (e.g., a row and column index within sensor array 100).

For each measured left PD pixel value within the particular sensor-array row (e.g., a non-zero pixel value within the accessed portion of the augmented left image data), phase detection offset block 336 can identify a center pixel value interpolated at the location of the corresponding left PD pixel, and can compute a difference (or offset) between the each of the measured left PD pixel values and the corresponding ones of the center pixel values. In some instances, phase detection offset block 336 can also calculate a sum of the absolute differences for the particular sensor-array row, which establishes a component of the first SAD vector for that particular sensor-array row. Additionally, phase detection offset block 336 can also perform any of the processes described herein to calculate values indicative of a SAD between the measured left PD pixels and corresponding interpolated center pixel values in each additional sensor-array row within sensor array 100, and to calculate additional components of the first SAD vector based on the compute SAD values.

In additional instances, phase detection offset block 336 can also apply these exemplary processes to portions of the center image data and the augmented right image data to compute components of the second SAD vector characterizing differences between the center and right images. For example, and using any of the processes described herein, phase detection offset block 336 can: (i) compute differences (or offsets) between each of the measured right PD pixel values and the corresponding center pixel values disposed within each sensor-array row of sensor array 100; (ii) calculate values indicative of an SAD for each of the sensor-array rows; and (ii) generate a component of the second SAD vector for each of the sensor-array rows based the corresponding calculated SAD values.

By ignoring the placeholder pixel values within the augmented left and right image data (e.g., the zero pixel values), phase detection offset block 336 can generate the first and second SAD vectors using left and right image data having a pixel-value resolution consistent with the extended- or full-horizontal density center image data. Further, in other implementations, phase detection offset block 336 can generate other values indicative of the differences between the left and right PD pixel values and the interpolated center pixel values, such as, but not limited to, a sum of the squared differences (SSD) and components of an SSD vector.

Further, in some examples described above, phase detection offset block 336 (FIG. 3) performs operations that augment the left and right image data with placeholder pixel values to generate up-scaled left and right image data having a resolution consistent with the center image data. In other implementations, phase detection offset block 336 (FIG. 3) can process the left, right, and center image data at their native pixel-value resolutions (e.g., without augmentation and the introduction of placeholder pixel values), and compute one or more of the differences or offsets described above relative to center pixel values interpolated or measured at pixel phase-shift locations disposed symmetrically about the locations of each PD pixel within sensor array 100, in addition to differences relative to center pixel values interpolated at the locations of the PD pixels within sensor array 100.

Figure 6:
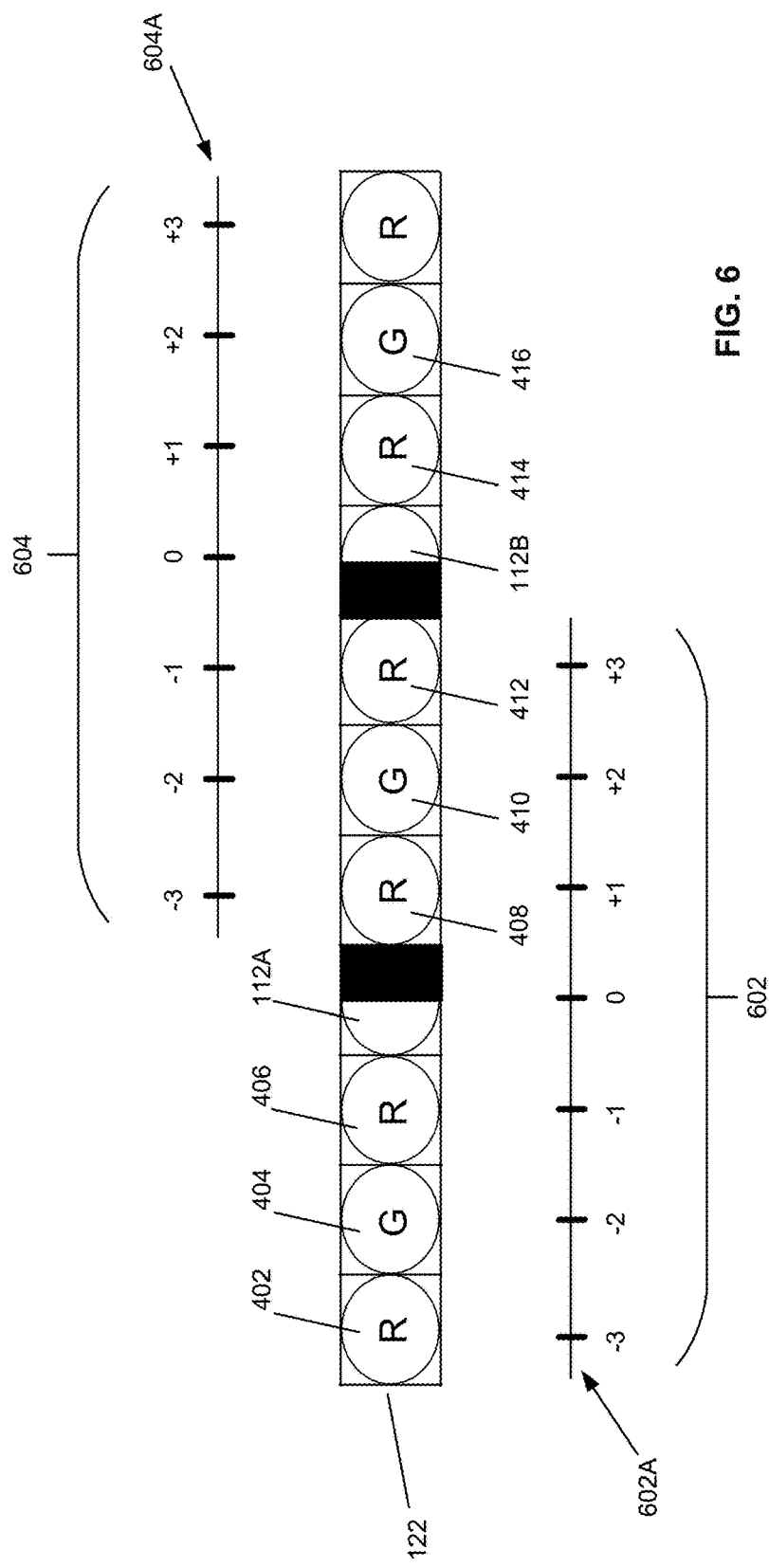

For example, as illustrated in FIG. 6, sensor-array row 122 can include left PD pixel 112A and right PD pixel 112B, which collectively constitute PD pixel pair 112. Phase detection offset block 336 can establish one or more pixel-shift locations about each of left PD pixel 112A and right PD pixel 112B based on factors that include, but are not limited to, a number of imaging pixels that separate left PD pixel 112A and right PD pixel 112B or a maximum blur (measured in pixels) of a sharpest edge captured by the imaging pixels within sensor array 100, e.g., imaging pixels 102.

Referring to FIG. 6, phase detection offset block 336 (FIG. 3) can establish, a three-pixel range 602 of positive and negative pixel-shift locations about left PD pixel 112A, and a corresponding three-pixel range 604 of positive and negative pixel-shift locations about right PD pixel 112B. The magnitude of ranges 602 and 604, e.g., three pixels, corresponds to a displacement (in imaging pixels) between left PD pixel 112A and right PD pixel 112B along sensor-array row 122, and each of the pixel-shift locations, shown generally along ranges 602A and 604A, coincide with locations of imaging pixels along sensor-array row 122. As described above, center pixel block 334 (FIG. 3) establishes center pixel values for the imaging pixels, e.g., through interpolation or measurement, and stores the center pixel values within database 304 to establish a portion of the center pixel line at extended or full horizontal density.

The three-pixel range example in FIG. 6 is used for ease of explanation. In other embodiments, the ranges 602 and 604 can correspond to a positive and negative pixel shift of eight pixels or sixteen pixels, or that can span the length of each sensor-array row having a PD pixel 112A or 112B.

For example, to compute differences or offsets between the left and center image data, and to compute the components of the first SAD vector that characterizes these differences or offsets, phase detection offset block 336 (FIG. 3) can identify a left PD pixel value measured by a corresponding left PD pixel within sensor array 100, such as left PD pixel 112A. Phase detection offset block 336 can determine a location of the left PD pixel 112A within sensor array 100, and obtain, from the center image data, a center pixel value interpolated at the location of left PD pixel 112A. In some instances, phase detection offset block 336 can compute an absolute difference between the measured left PD pixel value and corresponding interpolated center pixel value, which establishes an offset at the location of PD pixel 112A, and can store the computed difference within a portion of database 304, e.g., difference data 320.

Phase detection offset block 336 (FIG. 3) can also obtain center pixel values interpolated at each of the negative pixel-phase shift locations about left PD pixel 112A (e.g., the "−1," "−2," and "−3" positions along range 602) and at each of the positive pixel-phase shift locations about left PD pixel 112A (e.g., the "+1," "+2" and "+3" positions along range 602) from a portion of database 304 (FIG. 3), e.g., center pixel data 318 (FIG. 3). In some instances, phase detection offset block 336 can compute a set of difference values, including a respective absolute difference between the left PD pixel value measured by left PD pixel 112A and each of the interpolated center pixel values, to establish a difference or offset at each of the positive and negative pixel-phase shift locations. Phase detection offset block 336 can also perform operations that sum the set of difference values (the computed absolute differences), along with the computed absolute difference at the location of PD pixel 112A, to establish a component of the first SAD vector, which characterizes the differences or offsets between the left and center images at the location of left PD pixel 112A.

Further, in some instances, phase detection offset block 336 (FIG. 3) can implement any of these exemplary processes to compute an absolute difference between a measured left PD pixel value and a corresponding interpolated center pixel value at the location of each left PD pixel within sensor array 100, and further, between the measured left PD pixel value and center pixel values interpolated at the positive and negative pixel-phase shift locations about each of the left PD pixels. As described above, and when summed together, these computed absolute differences can establish an additional component of the first SAD vector that corresponds to the location of each left PD pixel within sensor array 100.

In further examples, phase detection offset block 336 (FIG. 3) can also perform any of the exemplary processes described herein to calculate differences or offsets between the center and right image data, and to compute the components of the second SAD vector that characterize these differences or offsets. For example, as described above, phase detection offset block 336 can identify a right PD pixel value measured by a corresponding right PD pixel within sensory array 100, such as right PD pixel 112B. Phase detection offset block 336 can determine a location of right PD pixel 112B within sensor array 100, and obtain, from a portion of database 304, a center pixel value interpolated at the location of left PD pixel 112A (e.g., from center image data stored within difference data 320). In some instances, phase detection offset block 336 can compute an absolute difference between the measured right PD pixel value and corresponding interpolated center pixel value, which establishes an offset at the location of right PD pixel 112B, and can store the computed difference within a portion of database 304, e.g., difference data 320.

Phase detection offset block 336 (FIG. 3) can also obtain center pixel values interpolated at the locations of each of negative pixel-phase shift locations about right PD pixel 112B (e.g., the "−1," "−2," and "−3" positions along range 604) and each of the positive pixel-phase shift locations about right PD pixel 112B (e.g., the "+1," "+2" and "+3" positions along range 604) from a portion of database 304 (FIG. 3), e.g., center pixel data 318 (FIG. 3). As described above, phase detection offset block 336 can compute an absolute difference between the right PD pixel value measured by right PD pixel 112B and each of the obtained center pixel values to establish an offset at each of the positive and negative pixel phase-shift locations. Phase detection offset block 336 can perform additional operations that sum these computed absolute differences, along with the computed absolute difference at the location of right PD pixel 112B, to establish a component of the first SAD vector, which characterizes the differences or offsets between the left and center images at the location of right PD pixel 112B.

Further, and as described herein, phase detection offset block 336 (FIG. 3) can implement these exemplary processes to compute an absolute difference between the measured right PD pixel value and corresponding interpolated center pixel value at the location of each right PD pixel within sensor array 100, and further, between the measured right PD pixel value and center pixel values interpolated at the positive and negative pixel-phase shift locations about each of the right PD pixel locations. When summed together, these computed absolute differences can establish components of the second SAD vector that correspond to each location of a right PD pixel within sensor array 100, and that characterizes a difference between the center and right images.

In some of the examples described herein, phase detection offset block 336 (FIG. 3) can perform operations that compute differences or offsets between portions of the left and center images, and between portions of the center and right images, on a pixel-by-pixel basis. In other implementations, described in greater detail below, phase detection offset block 336 (FIG. 3) can compute one or more of the differences or offsets described above based on comparisons between the left image data (or the right image data) and a portion of the center image data corresponding to the locations of each left PD pixel (or each right PD pixel) within sensor array 100, and against additional portions of the center image data corresponding to symmetric pixel-phase shift locations disposed about the locations of each left PD pixel (or each right PD pixel). As described below, the portions of the center image data may be characterized by a pixel-value resolution that is consistent with a pixel-value resolution characterizing both the left and right image data, and phase detection offset block 336 can compute the differences or offsets described based on operations performed directly on the left image data (or the right image data) and each of the portions of the center image data.

For example, referring to FIG. 6, phase detection offset block 336 (FIG. 3) can establish three-pixel range 602 of positive and negative pixel phase-shift locations about left PD pixel 112A (e.g., positive pixel phase-shift locations "+1," "+2" and "+3," and negative pixel phase-shift positions "−1," "−2" and "−3"). In some instances, phase detection offset block 336 can access the stored center image data (e.g., as maintained within difference data 320 of database 304 (FIG. 3)), and decompose the stored center image data into: (i) a first portion that includes the center pixel values interpolated at the locations of each left PD pixel within sensor array 100, and (ii) additional portions that include the center pixel values interpolated at corresponding ones of the positive and negative pixel phase-shift locations about each left PD pixel within sensor array 100.

Phase detection offset block 336 can, in some examples, compute an absolute difference between each PD pixel value in the left image data and a corresponding one of the interpolated center pixel values in the first portion of the center image data. The computed absolute differences can represent a difference or offset between the left and center images at the locations of the left PD pixels, and phase detection offset block 336 can calculate a sum of the absolute differences to generate a component of the first SAD vector. Additionally, in some instances, phase detection offset block 336 (FIG. 3) can compute an absolute difference between each PD pixel value in the left image data and a corresponding one of the center pixel values interpolated at the first positive pixel phase-shift location (e.g., the "+1" position of range 602). As described above, these computed absolute differences can represent a difference or offset between the left and center images at the first positive pixel phase-shift location, and phase detection offset block 336 can calculate a sum of the absolute differences to generate an additional component of the first SAD vector.

In further instances, phase detection offset block 336 can apply any of these processes to the left image data and to each additional portion of the center image data to compute absolute differences between the left and center images at each additional positive pixel phase-shift location (e.g., the "+2" and "+3" position of range 602), and absolute differences between the left and center images at each of the negative pixel phase-shift locations (e.g., the "−1," "−2," and "−3" position of range 602). As described above, phase detection offset block 336 can calculate sums of these absolute differences to generate additional components of the first SAD vector, e.g., corresponding respectively to the difference of offset between the left and center image data at each of the additional positive pixel phase-shift locations and at each of the negative pixel phase-shift locations.

In further examples, phase detection offset block 336 (FIG. 3) can also perform any of the exemplary processes described herein, on an image-by-image basis, to calculate differences or offsets between the center and right image data, and to compute the components of the second SAD vector that characterize these differences or offsets. For example, referring to FIG. 6, phase detection offset block 336 (FIG. 3) can establish three-pixel range 604 of positive and negative pixel phase-shift locations about right PD pixel 112B (e.g., positive pixel phase-shift locations "+1," "+2" and "+3," and negative pixel phase-shift positions "−1," "−2" and "−3"). In some instances, and as described above, phase detection offset block 336 can access the stored center image data (e.g., as maintained within difference data 320 of database 304 (FIG. 3)), and decompose the stored center image data into: (i) a first portion that includes the center pixel values interpolated at the locations of each right PD pixel within sensor array 100, and (ii) additional portions that include the center pixel values interpolated at corresponding ones of the positive and negative pixel phase-shift locations about each right PD pixel within sensor array 100.

Phase detection offset block 336 can, in some examples, compute an absolute difference between each PD pixel value in the right image data and a corresponding one of the interpolated center pixel values in the first portion of the center image data. The computed absolute differences can represent a difference or offset between the right and center images at the locations of the right PD pixels, and phase detection offset block 336 can calculate a sum of the absolute differences to generate a component of the second SAD vector. Additionally, in some instances, phase detection offset block 336 (FIG. 3) can compute an absolute difference between each PD pixel value in the right image data and a corresponding one of the center pixel values interpolated at the first positive pixel phase-shift location about each right PD pixel (e.g., the "+1" position of range 602). As described above, these computed absolute differences can represent a difference or offset between the right and center images at the first positive pixel phase-shift location, and phase detection offset block 336 can calculate a sum of the absolute differences to generate an additional component of the second SAD vector.

In further instances, phase detection offset block 336 can also perform the exemplary processes described herein to compute absolute differences between the right and center images at each additional positive pixel phase-shift location (e.g., the "+2" and "+3" position of range 604), and a difference or offset between the right and center images at each of the negative pixel phase-shift locations (e.g., the "−1," "−2," and "−3" position of range 604). As described above, phase detection offset block 336 can calculate a sum of each of the absolute differences to generate additional components of the second SAD vector, e.g., corresponding respectively to the difference of offset between the right and center image data at each of the additional positive pixel phase-shift locations and the negative pixel phase-shift locations.

Through the exemplary processes described herein, phase detection offset block 336 (FIG. 3) can perform operations that generate components of: (i) a first SAD vector that characterizes a difference or offset between the left and center images; and (ii) a second SAD vector that characterizes a difference or an offset between the center and right images. Phase detection offset block 336 can also perform operations to store the components of the first and second SAD vectors within database 304, e.g., within offset data (e.g., difference data 320). In implementations, phase detection offset block 336 can generate additional or alternative values indicative of the differences or offsets between the left and center images, and between the center and right images, such as values of a sum of the squared differences (SSD), and can compute components of a corresponding SSD vectors based on portions of the SSD values.

Referring back to FIG. 3, phase detection correlation block 338 of PDAF block 330 can access the first and second SAD vectors, e.g., as maintained within difference data 320, and process the components of the first and second SAD vectors to establish values of an optimal correlation point and an optimal phase difference. In one implementation, phase detection correlation block 338 can generate a combined SAD vector based on the accessed components of the first and second SAD vectors, e.g., by computing a sum or arithmetic mean of each component to generated corresponding combined components. Phase detection correlation block 338 can apply one or more interpolation algorithms to the components of the combined SAD vector to establish the value of the optimum correlation point for the combined SAD vector. Examples of the one or more interpolation algorithms include, but are not limited to, linear interpolation algorithms, bi-linear or bi-cubic interpolation algorithms, spline-based interpolation algorithms, or polynomial interpolation algorithms.

Phase detection correlation block 338 (FIG. 3) can further process the value of the optima; correlation point to establish the value of the optimal phase difference for the PD pixels within sensor array 100 (e.g., based on the center pixel lines determined at extended or full horizontal density). In some instances, the optimal phase difference established by phase detection correlation block 338 can include, but is not limited to, a square of the value of the optimal correlation point identified through the application of the one or more interpolation algorithms to the combined SAD vector. Phase detection correlation block 338 may perform operations that store data characterizing the values of the optimal correlation point and optimal phase difference within a portion of database 304, e.g., within PDAF data 322.

In other implementations, to compute the optimal phase difference, phase detection correlation block 338 (FIG. 3) can apply one or more of the interpolation algorithms described above to the components of the first SAD vector to establish a left-to-center correlation point, and to the components of the second SAD vector to establish a center-to-right correlation point. Phase detection correlation block 338 can further process the left-to-center and center-to-right correlation points to establish an optimal phase difference for the PD pixels within sensor array 188 (e.g., based on the center pixel lines determined at extended or full horizontal density). For example, phase detection correlation block 338 can establish the sum of the left-to-center and center-to-right correlation points as the optimal phase difference, and as described above, phase detection correlation block 338 can perform operations that store data characterizing the left-to-center and center-to-right correlation points and the optimal phase difference within a portion of database 304, e.g., within PDAF data 322.

In some examples, control block 332 can access the data characterizing the optimal phase difference. Based on data characterizing components of optical assembly 312 (e.g., positions of one or more lenses, such as primary lens 304 of FIGS. 3A-3C relative to sensor array 100), control block 332 can perform operations that convert the optimal phase difference into a corresponding autofocus adjustment that, if applied to the components of optical assembly 312, would modify the positions of one or more of these components and bring the ROI within the target scene corresponding to a selected focus point into focus. Control block 332 can also generate one or more control signals (e.g., lens position command signal) that, when provided to the one or more of actuators or motors 314, cause the one or more actuators or motors to modify the position or alignment of the one or more components of optical assembly 312 in accordance with the autofocus adjustment. As described above, the modification to the position or alignment of the one or more components of optical assembly 312 can correct the defocus condition (e.g., the front-focus condition or the back-focus condition of FIGS. 3B and 3C), and bring the ROI within the target scene into focus.

In some examples, one or more of the exemplary, extended- or full-density PDAF control processes described herein can establish an "optimal" phase difference based on a comparison between center pixel values interpolated at extended- or full-horizontal density and corresponding left and right pixel values measured by pairs of left and right PD pixels sparsely distributed within sensor array 100. For many applications, however, these full-density PDAF control processes can achieve an accurate autofocus adjustment based on comparisons between the extended- or full-horizontal density center pixel values and the left pixel values measured by left PD pixels in sensor array 100 (e.g., a "left channel comparison"), or alternatively, based on comparisons between the extended- or full-horizontal density center pixel values and the right pixel values measured by right PD pixels of sensor array 100 (e.g., a "right channel comparison").

In additional implementations, to facilitate single-channel comparisons and phase-difference detection, sensor array 100 can include either left PD pixels sparsely distributed among imaging sensors in a repeating pattern, or right PD pixels sparsely distributed among imaging sensors in a repeating pattern. By incorporating only left or right PD pixels within sensor array 100, an effective density of the imaging pixels within sensor array 100 can be increased, which also increases the measured luminance or color components of the image data captured by sensor array 100 without a significant reduction in an accuracy or effectiveness of the exemplary extended- or full-density PDAF control processes described herein.

Figure 7A:
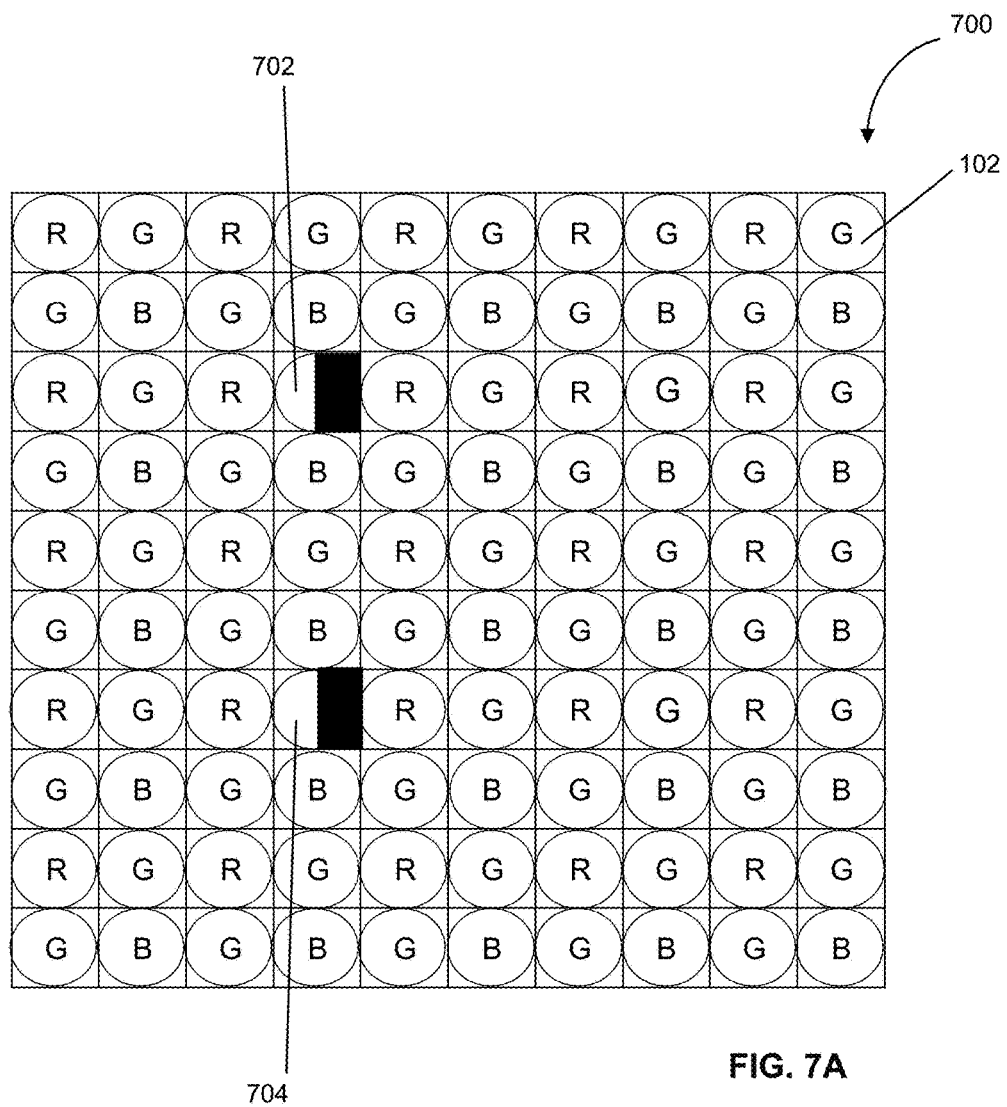
FIGS. 7A-7C are additional plan views of an exemplary sensor array, according to additional examples.
Figure 7B:
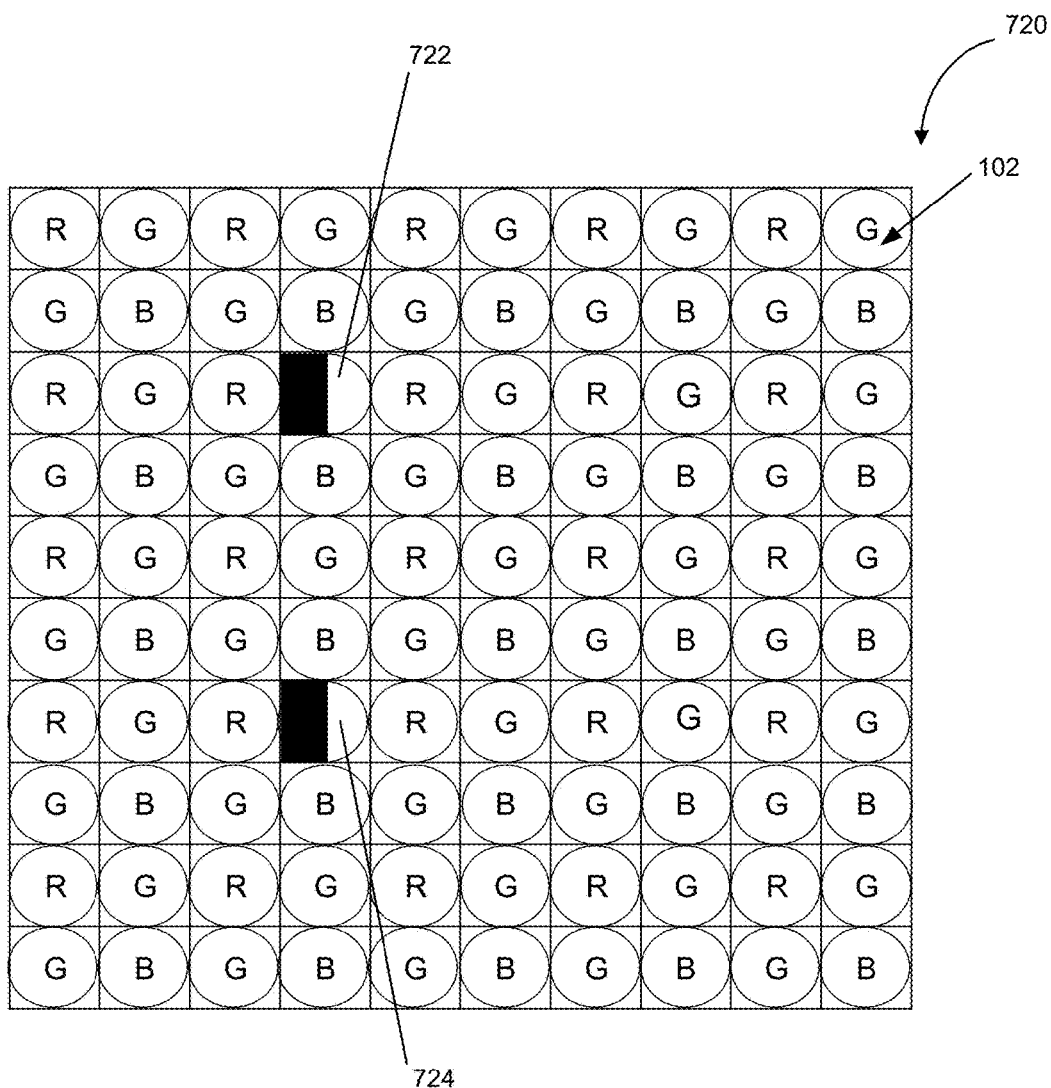

For example, as illustrated in FIG. 7A, sensor array 700 can include left PD pixels 702 and 704 interspersed among imaging pixels 102 in a sparse repeating pattern. As shown in FIG. 7B, sensor array 720 can include right PD pixels 722 and 724 interspersed among imaging pixels 102. As described herein, left PD pixels 702 and 704 (FIG. 7A) and right PD pixels 722 and 724 (FIG. 7B) can each include a microlens positioned over a filter layer (e.g., a color filter) and a selectively masked photodiode. In some examples, the image capture device 300 (FIG. 3) can perform any of the exemplary extended- or full-density PDAF control processes described herein to establish a phase difference and an autofocus adjustment based on a single-channel comparison between (i) center pixel values interpolated at extended or full horizontal density and (ii) either the left pixel values measured by left PD pixels 702 and 704 in sensor array 700 or the right pixel values measured by right PD pixels 722 and 724 in sensor array 720.

Further, due to vignetting and roll-off effects, a luminance (or color component) value measured by a right PD pixel at or near a left edge of a sensor array can be weaker than a corresponding value measured at or near a center or a right edge of the sensor array. Similarly, a luminance (or color component) value measured by a left PD pixel at or near a right edge of the sensor array can be weaker than a corresponding value measured at or near a center or a left edge of the sensor array. The reduction in measured luminance or color component values due to vignetting or roll-off effects can, in some instances, be equivalent to or exceed 50%.

Figure 7C:
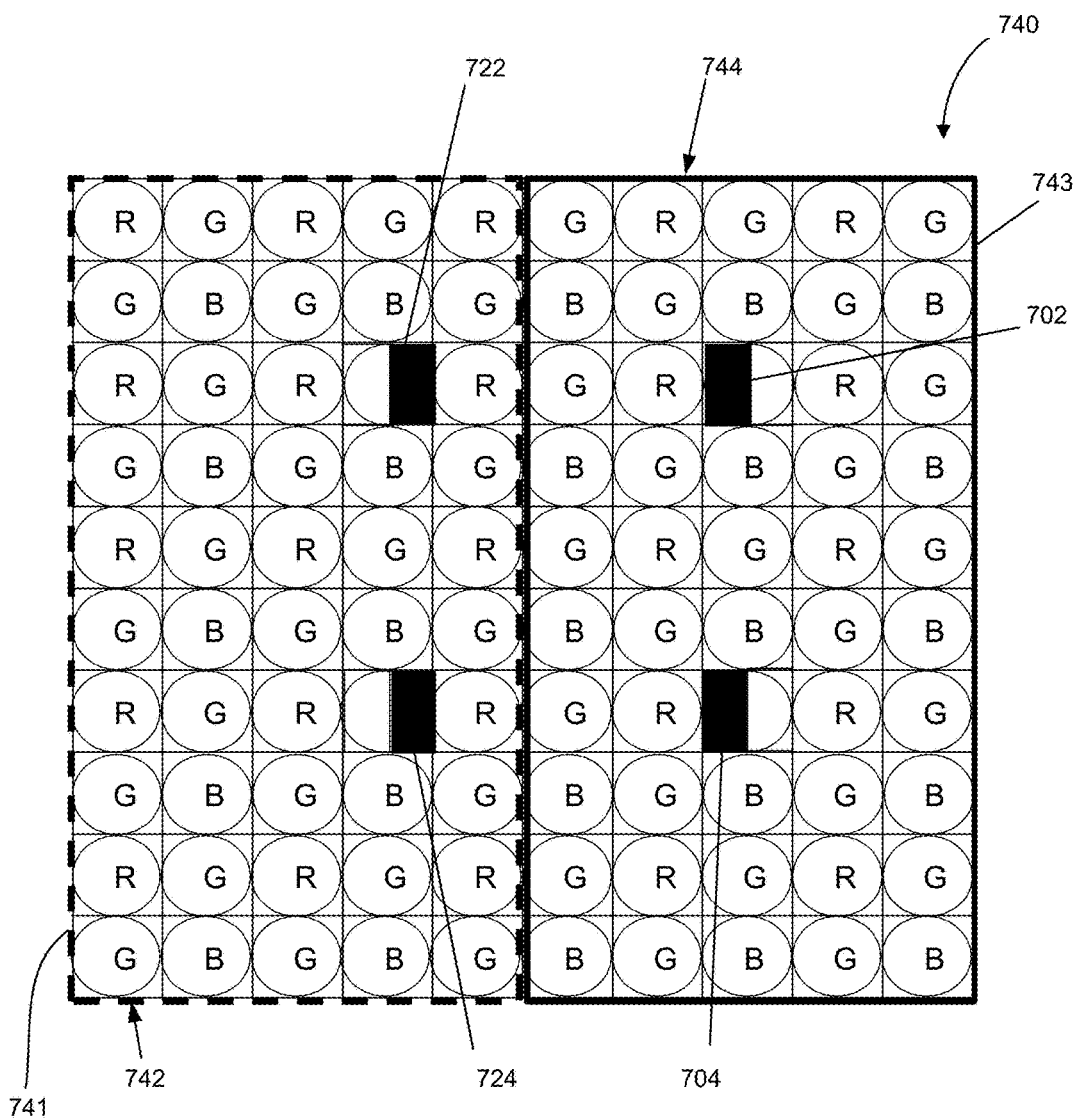

In further implementations, described in reference to FIG. 7C, a sensor array 740 can be partitioned into a first (left) region 742 disposed proximate a left sensor-array edge 741, and a second (right) region 744 disposed proximate to a right sensor-array edge 743. As illustrated in FIG. 7C, left PD pixels 722 and 724 can be sparsely distributed within first (left) region 742, and right PD pixels 702 and 704 can be sparsely distributed within second (right) region 744. As described above, left PD pixels 722 and 724 are insensitive to vignette or roll-off effects along left edge 741, and right PD pixels 702 and 704 are insensitive to vignette or roll-off effects along right edge 743. The selective distribution of the left PD pixels 722, 724 and right PD pixels 702, 704 within corresponding left and right regions 742 and 744 of sensor array 740 can improve the signal-to-noise ratio (SNR) and increase the measured luminance or color component of the image data captured by sensor array 740 without a significant reduction in an accuracy or effectiveness of the exemplary full-density PDAF control processes described herein.

Figure 8:
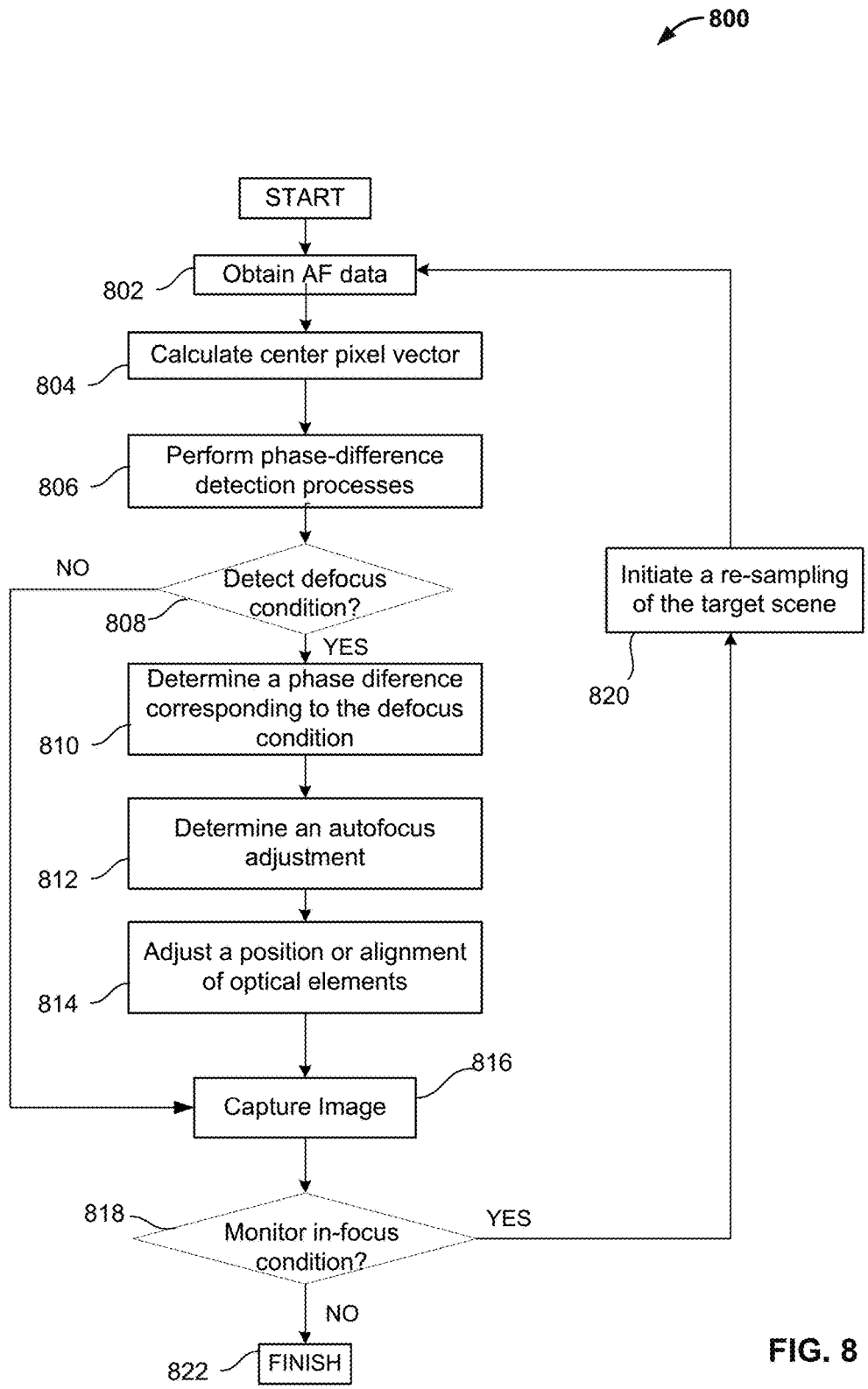
FIG. 8 is a flowchart of an exemplary process for performing phase-detection autofocus control, according to some examples.

FIG. 8 is a flowchart of example process 800 for performing extended- or full-density phase detection autofocus (PDAF) control processing on sampled pixel data, in accordance with one implementation. Process 800 can be performed by one or more processors executing instructions locally at an image capture device, such as processors 308 of image capture device 300 of FIG. 3. Accordingly, the various operations of process 800 can be represented by executable instructions held in storage media of one or more computing platforms, such as storage media 302 of image capture device 300.

For example, as described above, image capture device 300 can include a digital camera, (e.g., image capture hardware 310 of FIG. 3) having an optical assembly (e.g., optical assembly 312 of FIG. 3) that includes one or more optical components and lenses configured to collimate and focus incoming light onto an array of sensors (e.g., sensor array 100 of FIG. 3). To support the full-density PDAF control processing described herein, sensor array 100 can include pairs of phase-detection pixels (e.g., pairs of PD pixels) sparsely distributed among maskless pixels (e.g., imaging pixels) in regular, repeating patterns. Further, as described above, each of the imaging and PD pixels can include a photodiode on or in the substrate, and each of the photodiodes can be configured to collect incoming light and generate an electrical signal indicative of a measured value of a luminance (or color component) of the collected light.

Each of the PD pixels and the imaging pixels can also include a filter, such as a color filter, configured to admit light having a particular range of wavelengths, e.g., the red, blue, or green color filters described above. In other instances, one or more of the PD or imaging pixels can omit the color filter, or can include a clear filter configured to admit light of any wavelength. Further, in some instances, one or more of the PD pixel pairs can include a selectively positioned mask layer, which shields portions of the corresponding photodiodes from incident light and establishes selectively shielded pairs of PD pixels. The selectively shielded PD pixel pairs can, for example, include a left-shielded PD pixel sensitive to light falling incident onto a right portion of the sensor (e.g., a right PD pixel), and right-shielded PD pixel sensitive to light falling incident onto a left portion of the sensor (e.g., a left PD pixel). In other instances, described herein, a single microlens can be disposed over first and second maskless imaging pixels to establish the left and right PD pixels that support full-density PDAF control processing.

Referring to block 802 in FIG. 8, image capture device 300 (FIG. 3) may perform operations that obtain PD data characterizing a target scene. As described above, one or more PD and imaging pixels disposed within sensor array 100 can collect incoming light and generate electrical signals indicative of the values of luminance (or color component) measured by corresponding ones of the PD and imaging pixels. In some examples, sampling block 328 (FIG. 3), when executed by one or more processors 308 of image capture device 300, can receive the generated electrical signals and convert the generated electric signals into phase offset data that characterizes the target scene and the luminance or color component values measured by the PD and imaging pixels within sensor array 100. Sampling block 328 can also perform any of the operations described above to store the sensor data within a corresponding portion of database 304, e.g., within sensor data 316.

In block 804, center pixel block 334 can calculate the center pixel values for a sensor-array row of sensor array 100 containing a PD pixel. As described herein, the center pixel lines at full horizontal density include, for each sensor-array row of sensor array 100 having at least one pair of PD pixels, center pixel values interpolated at the positions of each pair of PD pixels (e.g., the positions of each left and right PD pixel) along with center pixel values measured or interpolated at the locations of each additional imaging pixel, e.g., imaging pixels 102. For example, when executed by one or more of processors 308 of image capture device 300, center pixel block 334 (FIG. 3) can perform any of the exemplary processes described herein calculate a center pixel value for each PD pixel disposed within sensor array 100 based on an interpolation of luminance or color component values measured by imaging pixels disposed within sensor-array rows adjacent to the PD pixels.

Alternatively, the center pixel value can be determined by applying any of the exemplary interpolation algorithms described above to values of luminance or color components measured by a "neighborhood" of imaging pixels disposed along sensor-array rows adjacent to the corresponding sensor-array row. For instance, the neighborhood of imaging pixels can include imaging pixels that include color filters configured to admit light having a particular range of wavelengths, such as a wavelength range associated with visible green light (e.g., "green imaging pixels"). Further, as described above, the neighborhood of imaging pixels can include a square array of green imaging pixels disposed about each of the PD pixels within sensor array 100 (e.g., a 3×3 array of green imaging pixels disposed on two pairs of adjacent sensor-array rows) or a rectangular array of green imaging pixels that includes each of the PD pixels (e.g., 3×4 arrays, 5×6 arrays, etc.).

Further, center pixel block 334 (FIG. 3) can calculate center pixel values for the imaging pixels disposed along each sensor-array row that includes a PD pixel, as described above in reference to FIGS. 5A and 5B.

As described above, center pixel block 334 can establish the values of luminance or color component measured by each of the green imaging pixels in the sensor-array row as the center pixel value for each of the additional green imaging pixels (e.g., without interpolation). Center pixel block 334 (FIG. 3) can also perform any of the exemplary processes described above to calculate a center pixel value for the additional red (or blue) imaging pixels in the same sensor-array row as the PD pixels, based on an interpolation of values of luminance or color component measured by adjacent green imaging pixels disposed on sensor-array rows above and/or below the additional red imaging pixels. In additional examples, described above, center pixel block 334 can calculate the center pixel values based on an interpolation of adjacently disposed red imaging pixels or blue imaging pixels (e.g., imaging pixels that include a color filter configured to admit visible blue light), or based on an interpolation of combinations of adjacently disposed red, green, or blue imaging pixels (e.g., in low-light conditions or when one or more of the PD pixels is filterless or includes a clear filter).

By calculating the center pixel value of not only each PD pixel disposed within sensor array 100, but also for each imaging pixel disposed within a sensor-array row that includes one or more of the PD pixel pairs, center pixel block 334 (FIG. 3) can establish center pixel lines at full horizontal density in block 804. In other implementations, center pixel block 334 can also establish center pixel lines having an extended horizontal density (e.g., in block 804).

For example, and as described above, center pixel lines at extended horizontal density include for each sensor-array row having at least one PD pixel, center pixel values interpolated at the positions of each PD pixel along with center pixel values measured or interpolated at the locations of a subset of the imaging pixels in the sensor-array row. As described below in greater detail, the generated center pixel lines can, at extended or full horizontal density, facilitate a comparison of and correlation between combinations of derived center images and measured left and right images, at not only the locations of the PD pixels, but also at discrete positions along the sensor-array rows that include the PD pixels. These comparisons and correlations can, in some examples, facilitate a full-density or an extended-density PDAF control processing of the sampled image data using a sparse distribution of PD pixel pairs of sensor array 100, and can reduce occurrences of errors related to random noise and aliasing without increasing a density of the PD pixel pairs within sensor array 100.

At block 806, referring back to FIG. 8, image capture device 300 can also perform one or more phase difference detection processes based on the measured left and right pixel values and the center pixel values generated at extended or full horizontal density. For example, when executed by one or more of processors 308 of image capture device 300, phase detection offset block 336 can perform any of the processes described herein to process the determined center pixel values, left pixel values, and right pixel values, and to compute image data characterizing a center image, a left image, and a right image for the locations of the PD pixels within sensor array 100 and for the pixel-shift locations. Through any of the exemplary processes described above, phase detection offset block 336 can further process the image data to generate, at the locations of the PD pixel pairs and for the pixel-shift locations, data characterizing differences (or offsets) between the left and center image data and between the center and right image data.

In additional examples, phase detection offset block 336 can perform any of the exemplary processes described herein to determine a first sum of the absolute differences (SAD) vector that characterizes the differences between the left and center image data, e.g. at the locations of the PD pixels and for the pixel-shift locations. Phase detection offset block 336 can also perform any of the exemplary processes described herein to determine a second SAD vector that characterizes the differences between the center and right image data, e.g. at the locations of the PD pixels and for the pixel-shift locations.

At block 808, image capture device 300 can perform operations to detect an occurrence of a defocus condition within the captured image data, based on the phase difference or offset data. For sensors having a single photodiode per microlens, a defocus condition is present when the phase difference or offset is a non-zero value. For sensors having two or more photodiodes per microlens, the defocus condition is present when the phase difference or offset deviates from a predetermined non-zero value. As described above, the defocus condition can correspond to a front-focus condition in which optical assembly 312 collimates and focuses light onto a plane disposed in front of sensor array 100, or alternatively, a back-focus condition in which optical assembly 312 collimates and focuses light onto a plane disposed behind of sensor array 100.

If image capture device 300 detects a defocus condition within the ROI of the image data (e.g., block 808; YES), block 810 is executed. If there is no defocus condition (e.g., phase difference equals zero) block 816 is executed.

At block 810, as illustrated in FIG. 8, image capture device 300 can perform operations that process the components of the first and second SAD vectors to determine an optimal phase difference corresponding to the detected defocus condition. For example, when executed by one or more of processors 308 of image capture device 300, phase detection correlation block 438 of PDAF block 330 can perform any of the processes described herein to generate a combined SAD vector based on the components of the first and second SAD vectors, and can apply any of the interpolation algorithms described above to the components of the combined SAD vector (e.g., corresponding to the locations of the PD pixel pairs and to the pixel-shift locations) to identify a left-to-right correlation point, which can be processed to determine an "optimal" value of a phase difference between the PD pixel pairs in sensor array 100. Examples of the one or more interpolation algorithms include, but are not limited to, linear interpolation algorithms, bi-linear or bi-cubic interpolation algorithms, spline-based interpolation algorithms, or polynomial interpolation algorithms, and as described above, the optimal value of the phase difference can represent a square of the optimal correlation point.

In other examples, at block 810, phase detection correlation block 438 of PDAF block 330 can apply one or more interpolation algorithms described above to the components of the first SAD vector to establish a left-to-center correlation point, and to the components of the second SAD vector to establish a center-to-right correlation point. Phase detection correlation block 438 can further process the first and second correlation points to establish the optimal value of the phase difference between the PD pixel pairs in sensor array 100. For instance, as described above, phase detection correlation block 438 can establish the sum of the left-to-center and center-to-right correlation points as the optimal value of the phase difference.

Image capture device 300 can also perform operations that determine an autofocus adjustment that corresponds and corrects for the optimal phase difference (e.g., in block 812), and that adjust a position or an alignment of one or more components of optical assembly 312 in accordance with the determined autofocus adjustment (e.g., in block 814). For example, when executed by one or more of processors 308 of image capture device 300, control block 432 can perform any of the exemplary processes described herein to convert the optimal phase difference into the corresponding autofocus adjustment (e.g., in block 814) and to generate one or more control signals that, when provided to the one or more of actuators or motors 314, cause actuators or motors 314 to modify the position or alignment of the one or more components of optical assembly 312 in accordance with the autofocus adjustment. As described above, the modification to the position or alignment of the one or more components of optical assembly 312 can account for and correct the defocus condition (e.g., the front-focus condition or the back-focus condition of FIGS. 3B and 3C), and bring the target scene into focus (e.g., an in-focus condition of FIG. 3A).

In block 816, image capture device 300 captures a frame of image data.

At block 818, image capture device 300 can determine whether to perform additional PDAF operations (e.g., if the image capture device is operating in AI-servo mode to continue focusing while tracking a moving object). If image capture device 300 were to determine to perform additional PDAF operation (e.g., block 818; YES), block 820 is executed to re-sample the target scene and continue to monitor the in-focus condition of the target scene. To continue focusing, image capture device 300 can perform operations that initiate a re-sampling of the target scene (e.g., in block 820). Exemplary process 800 can then pass back to block 802, and image capture device 300 can perform any of the processes described herein to obtain image data characterizing the target scene.

Alternatively, if image capture device 300 is operating in a single-shot mode, in-focus condition of the target scene (e.g., block 818; NO), exemplary process 800 is then completed in block 822.

Referring back to block 808, if image capture device 300 were unable to detect a defocus condition within one or more portions of the obtained image data (e.g., block 808; NO), the target scene may be characterized by an in-focus condition. Image capture device 300 can, in some examples, elect to further monitor the in-focus condition of the target scene (e.g., block 818; YES). Exemplary process 800 can then pass back to block 820, and image capture device 300 can perform any of the processes described herein to initiate a re-sampling of the target scene by sensor array 100.

In some implementations, as described above, an image capture device (e.g., image capture device 300) can apply one or more extended- or full-density PDAF control processes to luminance or color component values measured by a sensor array that includes a plurality of imaging pixels (e.g., maskless photodiodes configured to sample incident light with or without a color filter) and sparsely distributed, interspersed pairs of left and right PD pixels (e.g., a corresponding pair of right- and left-shielded PD pixels, or left and right PD pixels sharing a single microlens can be disposed over a pair of imaging pixels). As described below, these extended- or full-density PDAF control processes, as applied to the measured or calculated luminance or color component values, can reduce errors related to random noise and aliasing without increasing a density of the sparsely distributed PD pixels within the sensor array, and can be used in addition to, or as an alternative to, any of the sparse PDAF control processing techniques described above.

Figure 9A:
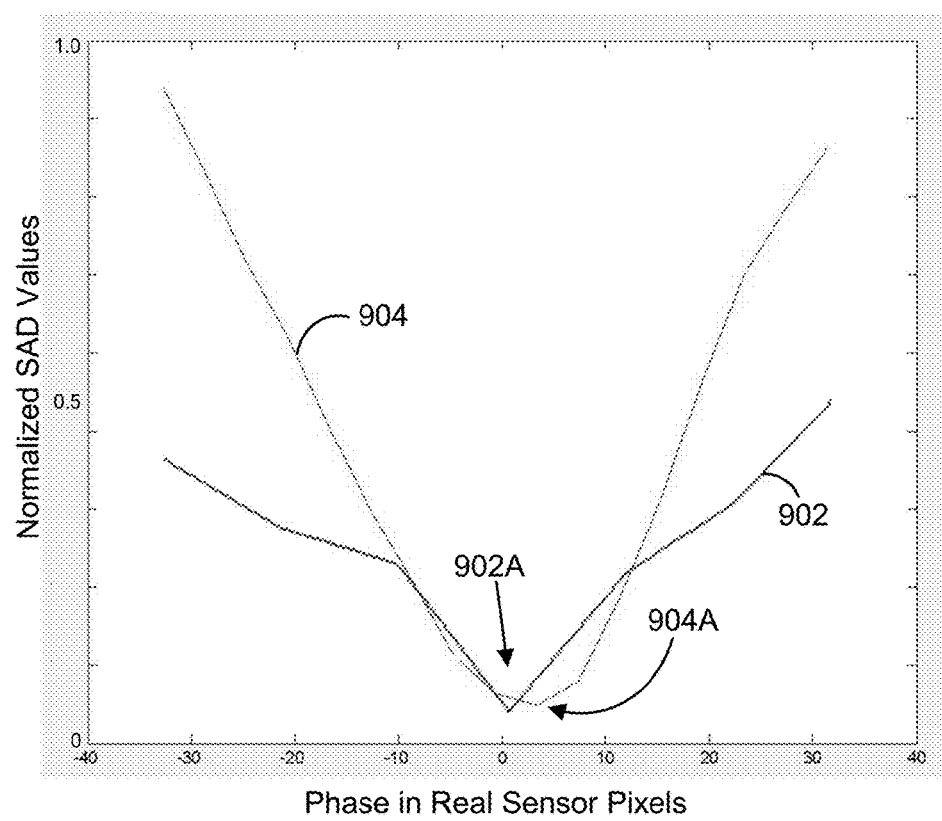
FIGS. 9A-9C are diagrams illustrating additional aspects of an exemplary process for performing phase-detection autofocus control, according to some examples.

For example, FIG. 9A characterizes a normalized sum of absolute differences (SAD) value as a function of sensor-pixel phase for SAD values computed using the sparse PDAF control processes described above (e.g., trace 902) and using the extended- or full-density PDAF control processes described above (e.g., trace 904). As illustrated in FIG. 9A, the low center-pixel-line resolution characteristic of sparse PDAF control processing can cause rapid variations in the normalized SAD value near a minimum value (e.g., shown generally at 902A), and these rapid variations can introduce errors in the determination of an optimal phase difference using sparse PDAF control processes. In contrast, the extended- or full-density PDAF control processes described above generate the center pixel lines at higher density (e.g., as compared to sparse PDAF control processing), and the resulting SAD values exhibit smaller variations near the minimum value (e.g., shown generally at 904A). The reduction in normalized SAD-value variation near the minimum can increase an accuracy at which the extended- or full-density PDAF control processes process the SAD values and determine the optimal phase difference.

Figure 9B:
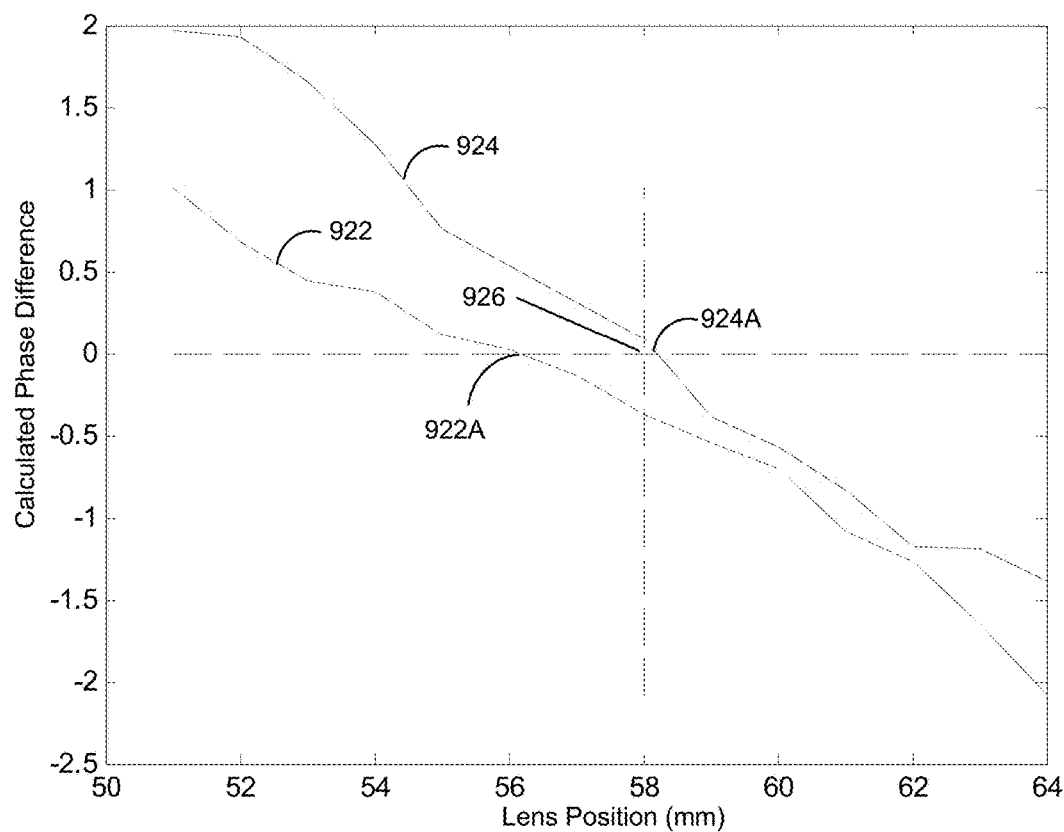

FIG. 9B characterizes values of phase difference as a function of a lens position (e.g., in mm) for phase differences computing using the sparse PDAF control processes described above (e.g., trace 922) and using the extended- or full-density PDAF control processes described above (e.g., trace 924). In some instances, a computed phase difference would ideally respond to variations in lens position in a linear fashion, with an optimal lens position corresponding to a computed value of zero phase difference. For example, in FIGS. 10B and 10C, an optimal lens position 926, e.g., a lens position that elicits computed value of zero phase difference, could correspond to 58 mm under idealized conditions (e.g., a linear phase-difference response to changes in lens position).

Referring to FIG. 9B, the sparse PDAF control processes determine an optimal lens position 926A of approximately 56 mm, while the extended- or full-density PDAF control processes determine an optimal lens position 924A of approximately 58.25 mm. As described above, the higher-density center pixel lines characteristic of these extended- or full-density PDAF control processes can result in a more accurate autofocus control without a corresponding increase in PD-pixel density within the sensor array.

Figure 9C:
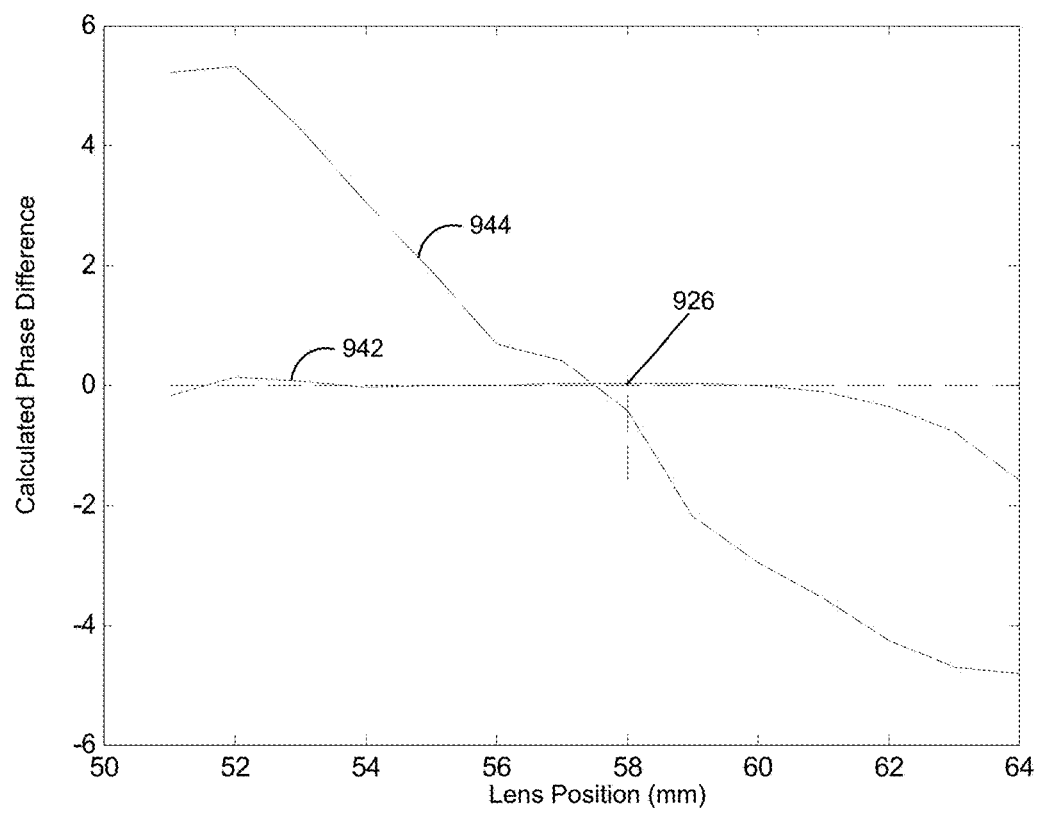

Further, and as described above, sparse PDAF control processes can be susceptible to aliasing errors in circumstances where a target scene includes high-frequency visual patterns (e.g., closely spaced parallel lines or edges). For example, due to the sparsity of the left and right PD pixels within the sensor array, the left and right PD pixels of one or more of the PD pixel pairs may be disposed on opposite sides of a sharp edge within the PD pixel data, which may introduce errors in the calculation of the phase-detection offset data described above. As illustrated in FIG. 9C, for target scenes exhibiting high-frequency visual patterns, phase-difference values 942 computed by sparse PDAF control processes fail to exhibit the linearity characteristic of phase-difference values 944 computed by the extended- or full-density PDAF control processes described above. Further, the aliasing errors associated with these high-frequency visual patterns, and the resulting non-linear phase-difference response, render the determination of an "optimal" phase difference and corresponding lens position impractical using sparse PDAF control processing.

The methods, systems, and devices described herein can be at least partially embodied in the form of computer-implemented processes and apparatus for practicing the disclosed processes. The disclosed methods can also be at least partially embodied in the form of tangible, non-transitory machine-readable storage media encoded with computer program code. The media can include, for example, random access memories (RAMs), read-only memories (ROMs), compact disc (CD)-ROMs, digital versatile disc (DVD)-ROMs, "BLUE-RAY DISC"™ (BD)-ROMs, hard disk drives, flash memories, or any other non-transitory machine-readable storage medium. When the computer program code is loaded into and executed by a computer, the computer becomes an apparatus for practicing the method. The methods can also be at least partially embodied in the form of a computer into which computer program code is loaded or executed, such that, the computer becomes a special purpose computer for practicing the methods. When implemented on a general-purpose processor, the computer program code segments configure the processor to create specific logic circuits. The methods can alternatively be at least partially embodied in application specific integrated circuits for performing the methods. In other instances, the methods can at least be embodied within sensor-based circuitry and logic.

The subject matter has been described in terms of exemplary embodiments. Because they are only examples, the claimed inventions are not limited to these embodiments. Changes and modifications can be made without departing the spirit of the claimed subject matter. It is intended that the claims cover such changes and modifications.

We claim:

1. A method for performing phase-detection autofocus control, comprising:
   receiving, by one or more processors, luminance values measured by a plurality of sensing elements in a sensor array, the sensing elements comprising imaging pixels and phase-detection pixels;
   comparing, by the one or more processors, luminance values measured by at least one of the phase-detection pixels to luminance values associated with a subset of the imaging pixels including two or more imaging pixels, the comparing being performed at extended horizontal density or full horizontal density along a first sensor-array row that includes the at least one phase-detection pixel and the two or more imaging pixels; and
   performing, by the one or more processors, a phase-detection autofocus operation based on an outcome of the comparison.

2. The method for performing phase-detection autofocus control according to claim 1, wherein the comparing at full horizontal density comprises comparing the luminance value measured by the at least one phase-detection pixel and the luminance values associated with each of the imaging pixels within the first sensor-array row.

3. The method for performing phase-detection autofocus control according to claim 1, wherein a first one of the luminance values associated with the subset of the imaging pixels is measured by a corresponding one of the imaging pixels, and a second one of the luminance values associated with the subset of the imaging pixels is an interpolated value derived from luminance values measured by the subset of the imaging pixels.

4. The method for performing phase-detection autofocus control according to claim 3, wherein the subset of the imaging pixels comprises at least one imaging pixel having a color filter, the color filter being configured to admit green light.

5. The method for performing phase-detection autofocus control according to claim 1, further comprising:
   calculating a respective interpolated luminance value associated with each respective phase detection pixel, the interpolated luminance values being derived from the luminance values measured by corresponding subsets of the imaging pixels;
   wherein the comparing further comprises comparing the luminance value measured by a first phase-detection pixel in the first sensor array row to the interpolated luminance value associated with a second phase detection pixel in the first sensor array row.

6. The method for performing phase-detection autofocus control according to claim 1, wherein:
   the sensor array has a plurality of sensor-array rows, the plurality of sensor-array rows including the first sensor-array row and a second sensor-array row; and
   the phase detection pixels comprise a first phase detection pixel and a second phase detection pixel, the first phase detection pixel being disposed within the first sensor-array row, the first sensor array row including a first subset of the imaging pixels, and the second phase detection pixel being disposed within the second sensor-array row, the second sensor array row including a second subset of the imaging pixels; and
   the method further comprises:
   determining, for the first sensor array row, a value indicative of a comparison between the luminance value measured by the first phase detection pixel and the respective luminance values measured or interpolated at locations of each of the first subset of imaging pixels; and
   determining, for the second sensor array row, a value indicative of a comparison between the luminance value measured by the second phase detection pixel and the luminance values measured or interpolated at respective locations of each of the second subset of imaging pixels.

7. The method for performing phase-detection autofocus control according to claim 1, further comprising combining a set of difference values, the set of difference values including a respective difference between the luminance value of the at least one phase-detection pixel and a respective luminance value of each one of the subset of imaging pixels within the first sensor-array row.

8. The method for performing phase-detection autofocus control according to claim 7, wherein combining the set of difference values includes computing a sum of absolute differences for the set of difference values.

9. The method for performing phase-detection autofocus control according to claim 1, wherein a first one of the phase detection pixels comprises a first masked photodiode having an exposed left portion and a shielded right portion, and a second one of the phase detection pixels comprises a second masked photodiode having a shielded left portion and an exposed right portion.

10. The method for performing phase-detection autofocus control according to claim 9, wherein:
    each phase detection pixel having an exposed left portion and a shielded right portion is disposed within a left portion of the sensor array; and
    each phase detection pixel having an exposed right portion and a shielded left portion is disposed within a right portion of the sensor array.

11. The method for performing phase-detection autofocus control according to claim 1, wherein:
    a first one of the phase detection pixels comprises a first maskless pixel, and a second one of the phase detection pixels comprises a second maskless pixel; and
    a single microlens is disposed over the first and second maskless pixels.

12. The method for performing phase-detection autofocus control according to claim 1, wherein performing the phase-detection autofocus operation comprises:
    based on an outcome of the comparison, computing values indicative of differences between the luminance values measured by the at least one phase-detection pixel and luminance values associated with each of the imaging pixels in the subset;
    determining a phase difference associated with the phase-detection pixels based on the computed values; and
    determining an autofocus adjustment corresponding to the determined phase difference.

13. The method for performing phase-detection autofocus control according to claim 12, further comprising:
    generating a command signal to modify a position or an alignment of an optical component in accordance with the determined autofocus adjustment; and
    providing the generated command signal to an actuator or motor coupled to the optical component, to modify the position of the optical component.

14. A device for performing phase-detection autofocus control, comprising:
    a non-transitory, machine-readable storage medium storing instructions; and at least one processor configured to be coupled to the non-transitory, machine-readable storage medium, the at least one processor configured by the instructions to:
receive luminance data from a plurality of sensing elements in a sensor array, the sensing elements comprising imaging pixels and phase-detection pixels, and the luminance data comprising luminance values measured by the imaging pixels and phase-detection pixels;
compare luminance values measured by at least one of the phase-detection pixels to luminance values associated with a subset of the imaging pixels including two or more imaging pixels, the comparison being performed at extended horizontal density or full horizontal density along a first sensor-array row that includes the at least one phase-detection pixel and the two or more imaging pixels; and
perform a phase-detection autofocus operation based on an outcome of the comparison.

15. The device for performing phase-detection autofocus control according to claim 14, wherein the comparison at full horizontal density comprises a comparison of the luminance value measured by the at least one phase-detection pixel and the luminance values associated with each of the imaging pixels within the first sensor-array row.

16. The device for performing phase-detection autofocus control according to claim 14, wherein a first one of the luminance values associated with the subset of the imaging pixels is measured by a corresponding one of the imaging pixels, and a second one of the luminance values associated with the subset of the imaging pixels is an interpolated value derived from luminance values measured by the subset of the imaging pixels.

17. The device for performing phase-detection autofocus control according to claim 14, wherein the subset of the imaging pixels comprises at least one imaging pixel having a green color filter.

18. The device for performing phase-detection autofocus control according to claim 14, wherein the at least one processor is further configured to:
calculate a respective interpolated luminance value associated with each respective phase detection pixel, the interpolated luminance values being derived from the luminance values measured by corresponding subsets of the imaging pixels; and
compare the luminance values measured by a first phase-detection pixel in the first sensor array row to the interpolated luminance values associated with a second phase detection pixel in the first sensor array row.

19. The device for performing phase-detection autofocus control according to claim 14, wherein:
the sensor array has a plurality of sensor-array rows, the plurality of sensor-array rows including the first sensor-array row and a second sensor-array row;
the phase detection pixels comprise a first phase detection pixel and a second phase detection pixel, the first phase detection pixel being disposed within the first sensor-array row, the first sensor array row including a first subset of the imaging pixels, and the second phase detection pixel being disposed within the second sensor-array row, the second sensor array row including a second subset of the imaging pixels; and
the at least one processor is further configured to:
determine a value indicative of differences between the first phase detection pixel and the respective luminance values measured or interpolated at a location of each of the first subset of the imaging pixels; and
determine a value indicative of differences between the second phase detection pixel and the luminance values measured or interpolated at a location of each of the second subset of the imaging pixels.

20. The device for performing phase-detection autofocus control according to claim 14, further comprising combining a set of difference values, the set of difference values including a respective difference between the luminance value of the at least one phase-detection pixel and a respective luminance value of each one of the subset of imaging pixels within the first sensor-array row.

21. The device for performing phase-detection autofocus control according to claim 14, wherein a first one of the phase detection pixel comprises a first masked photodiode having an exposed left portion and a shielded right portion, and a second one of the phase detection pixels comprises a second masked photodiode having a shielded left portion and an exposed right portion.

22. The device for performing phase-detection autofocus control according to claim 21, wherein:
each phase detection pixel having an exposed left portion and a shielded right portion is disposed within a left portion of the sensor array; and
each phase detection pixel having an exposed right portion and a shielded left portion is disposed within a right portion of the sensor array.

23. The device for performing phase-detection autofocus control according to claim 14, wherein:
a first one of the phase detection pixels comprises a first maskless sensor, and a second one of the phase detection pixels comprises a second maskless sensor; and
a single microlens is disposed over the first and second maskless sensors.

24. The device for performing phase-detection autofocus control according to claim 14, wherein the at least one processor is further configured to:
based on an outcome of the comparison, compute values indicating differences between the luminance values measured by the at least one phase-detection pixels and luminance values associated with each of the imaging pixels in the subset;
determine a phase difference associated with the phase-detection pixels based on the computed values; and
determine an autofocus adjustment corresponding to the determined phase difference.

25. The device for performing phase-detection autofocus control according to claim 24, wherein the at least one processor is further configured to apply an interpolation algorithm to the computed values.

26. The device for performing phase-detection autofocus control according to claim 14, wherein:
the device further comprises:
the sensor array;
an optical component; and
a motor or actuator, the motor or actuator being coupled to the at least one processor and configured to modify a position or an alignment of the optical component relative to the sensor array; and
the at least one processor is further configured to:
generate a command signal to modify the position or the alignment of an optical component in accordance with the determined autofocus adjustment; and
provide the generated command signal to the motor or actuator.

27. An apparatus for performing phase-detection autofocus control, comprising:

means for receiving luminance data from a plurality of sensing elements in a sensor array, the sensing elements comprising imaging pixels and phase-detection pixels, and the luminance data comprising luminance values measured by the imaging pixels and phase-detection pixels;

means for comparing luminance values measured by at least one of the phase-detection pixels to luminance values associated with a subset of the imaging pixels including two or more imaging pixels, the comparing being performed at extended horizontal density or full horizontal density along a first sensor-array row that includes the at least one phase-detection pixel and the two or more imaging pixels; and means for performing a phase-detection autofocus operation based on an outcome of the comparison.

28. A non-transitory, machine-readable storage medium storing program instructions that, when executed by at least one processor, perform a method for performing phase-detection autofocus control, the machine-readable storage medium comprising:

instructions for receiving luminance data from a plurality of sensing elements in a sensor array, the sensing elements comprising imaging pixels and phase-detection pixels, and the luminance data comprising luminance values measured by the imaging pixels and phase-detection pixels;

instructions for comparing luminance values measured by at least one of the phase-detection pixels to luminance values associated with a subset of the imaging pixels including two or more imaging pixels, the comparing being performed at extended horizontal density or full horizontal density along a first sensor-array row that includes the at least one phase-detection pixel and the two or more imaging pixels; and instructions for performing a phase-detection autofocus operation based on an outcome of the comparison.

* * * * *